US012757719B2

(12) United States Patent
Kim

(10) Patent No.: US 12,757,719 B2
(45) Date of Patent: Oct. 6, 2026

(54) SEMICONDUCTOR DEVICE HAVING A THROUGH CONTACT CONNECTED TO A BURIED PATTERN AND PENETRATING A FIELD INSULATION FILM AND AN ETCH STOP LAYER

(71) Applicant: SAMSUNG ELECTRONICS CO., LTD., Suwon-si (KR)

(72) Inventor: Jin Bum Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 449 days.

(21) Appl. No.: 18/367,851

(22) Filed: Sep. 13, 2023

(65) Prior Publication Data

US 2024/0266288 A1 Aug. 8, 2024

(30) Foreign Application Priority Data

Feb. 3, 2023 (KR) ........................ 10-2023-0014780

(51) Int. Cl.
*H10D 62/10* (2025.01)
*H10D 30/01* (2025.01)
(Continued)

(52) U.S. Cl.
CPC ........ *H10W 20/427* (2026.01); *H10D 30/014* (2025.01); *H10D 30/43* (2025.01);
(Continued)

(58) Field of Classification Search
CPC ....... H10D 30/43–435; H10D 30/6757; H10D 30/6735; H10D 30/501–509;
(Continued)

(56) References Cited

U.S. PATENT DOCUMENTS 10,985,057 B2 4/2021 Jourdain et al.
11,380,607 B2 7/2022 Kim et al.
(Continued)

FOREIGN PATENT DOCUMENTS

CN 115472606 A 12/2022
KR 10-2020-0008515 A 1/2020
(Continued)

OTHER PUBLICATIONS

Communication dated Jul. 11, 2024, issued by the European Patent Office in counterpart European Application No. 24151093.2.
(Continued)

*Primary Examiner* — Younes Boulghassoul
(74) *Attorney, Agent, or Firm* — Sughrue Mion, PLLC

(57) ABSTRACT

A semiconductor device may include: a substrate including a first side and a second side; an active pattern that is on the first side and extends in a first direction; an etch stop layer that extends along the first side and does not extend along side faces of the active pattern; a field insulating film that is on the first side and covers at least a part of the side faces of the active pattern; a gate structure that extends in a second direction on the active pattern and the field insulating film; a through contact that extends in a third direction and penetrates the field insulating film and the etch stop layer; a buried pattern connected to the through contact, inside the substrate; and a backside wiring structure that is on the second side and electrically connected to the buried pattern.

20 Claims, 46 Drawing Sheets

(51) Int. Cl.

| | |
|---|---|
| ***H10D 30/43*** | (2025.01) |
| ***H10D 30/67*** | (2025.01) |
| ***H10D 64/01*** | (2025.01) |
| ***H10W 20/00*** | (2026.01) |
| ***H10W 20/20*** | (2026.01) |
| ***H10W 20/40*** | (2026.01) |
| ***H10W 20/41*** | (2026.01) |

(52) U.S. Cl.
CPC ..... *H10D 30/6729* (2025.01); *H10D 30/6735* (2025.01); *H10D 62/121* (2025.01); *H10D 64/01* (2025.01); *H10W 20/023* (2026.01); *H10W 20/0234* (2026.01); *H10W 20/0242* (2026.01); *H10W 20/0245* (2026.01); *H10W 20/074* (2026.01); *H10W 20/20* (2026.01); *H10W 20/435* (2026.01); *H10W 20/481* (2026.01)

(58) Field of Classification Search
CPC ..... H10D 30/014; H10D 30/019–0198; H10D 62/119–123; H10D 84/851; H10D 84/852; H10D 84/832; H10D 84/833; H10D 84/0158; H10D 84/0193; H10D 84/834; H10D 84/853; H10D 86/011; H10D 86/215; H10D 30/024–0245; H10D 30/62–6219; H10D 30/6219; H10D 30/6729; H10D 64/251–259; H10D 84/0149; H10D 84/0186; H10D 84/038; H10B 12/36; H10B 12/056; H01L 21/823475; H01L 21/823871; H01L 21/76885; H01L 21/76895; H01L 21/76897; H01L 21/76804; H01L 21/76805; H01L 21/76807–76813; H01L 21/76816; H01L 21/76877; H01L 23/5226; H01L 23/5283; H01L 23/5286; H01L 23/528; H01L 23/481; H01L 23/535; H01L 23/5384; H01L 23/5386; H01L 23/49827; H01L 29/4175; H01L 2225/06541–06544; H01L 2225/06548; H01L 21/76898; H01L 21/486; H01L 21/76829; H10W 70/65–658; H10W 20/063–0636; H10W 20/069–0698; H10W 20/081–089; H10W 20/056; H10W 20/0595; H10W 20/057; H10W 20/42–422; H10W 20/435; H10W 20/438; H10W 20/427; H10W 20/43; H10W 20/20–233; H10W 70/635; H10W 70/611; H10W 70/095; H10W 20/023–0265
See application file for complete search history.

(56) References Cited

U.S. PATENT DOCUMENTS

| | | | | |
|---|---|---|---|---|
| 2021/0408287 | A1 | 12/2021 | Hiblot et al. | |
| 2022/0020666 | A1 | 1/2022 | Van Dai et al. | |
| 2022/0223526 | A1 | 7/2022 | Min | |
| 2022/0230947 | A1 | 7/2022 | Park et al. | |
| 2022/0367454 | A1 | 11/2022 | Chung et al. | |
| 2022/0384602 | A1 | 12/2022 | Su et al. | |
| 2023/0100113 | A1* | 3/2023 | Xie | H01L 21/76897 257/774 |
| 2023/0387239 | A1* | 11/2023 | Yang | H10D 30/6757 |
| 2024/0030134 | A1* | 1/2024 | Cheng | H10D 30/014 |
| 2024/0071925 | A1* | 2/2024 | Qin | H10D 64/01 |
| 2024/0136254 | A1* | 4/2024 | Kang | H10D 62/121 |
| 2024/0145556 | A1* | 5/2024 | Kim | H10D 62/121 |
| 2024/0162311 | A1* | 5/2024 | Oh | H01L 23/485 |
| 2024/0213119 | A1* | 6/2024 | Kim | H10D 84/83 |
| 2024/0222450 | A1* | 7/2024 | Lee | H01L 23/535 |
| 2024/0243064 | A1* | 7/2024 | Seo | H01L 23/535 |

FOREIGN PATENT DOCUMENTS

| | | | |
|---|---|---|---|
| KR | 10-2020-0034227 | A | 3/2020 |
| KR | 10-2020-0133092 | A | 11/2020 |
| KR | 10-2020-0133630 | A | 11/2020 |
| KR | 10-2021-0148543 | A | 12/2021 |

OTHER PUBLICATIONS

Communication dated Jul. 23, 2024, issued by the European Patent Office in counterpart European Application No. 24151093.2.
Office Action issued May 29, 2026 by the Korean Ministry of Intellectual Property for KR Patent Application No. 10-2023-0014780.

* cited by examiner

SEMICONDUCTOR DEVICE HAVING A THROUGH CONTACT CONNECTED TO A BURIED PATTERN AND PENETRATING A FIELD INSULATION FILM AND AN ETCH STOP LAYER

CROSS-REFERENCE TO RELATED APPLICATION

This application claims priority from Korean Patent Application No. 10-2023-0014780, filed on Feb. 3, 2023, in the Korean Intellectual Property Office, the disclosure of which is incorporated by reference herein in its entirety.

BACKGROUND

1. Technical Field

Embodiments of the present disclosure relate to a semiconductor device and a method for fabricating the same, and more specifically, to a semiconductor device including a backside wiring pattern and a method for fabricating the same.

2. Description of the Related Art

Due to characteristics such as miniaturization, multi-functionality and/or low fabricating cost, semiconductor devices have been spotlighted as important elements in the electronic industry. The semiconductor devices may be classified into semiconductor memory devices that store logic data, semiconductor logic devices that perform an arithmetic operation on logic data, and hybrid semiconductor devices that include memory elements and logic elements.

As the electronic industry is highly developed, requirements for characteristics of the semiconductor devices are gradually increasing. For example, requirements for high reliability, high speed and/or multi-functionality for the semiconductor devices are gradually increasing. In order to satisfy these required characteristics, structures inside the semiconductor devices are gradually complicated and highly integrated.

SUMMARY

One or more embodiments of the present disclosure provide a semiconductor device that may have improved power, performance, area, and cost (PPAC).

According to embodiments of the present disclosure, a method for fabricating a semiconductor device having improved PPAC is provided.

According to embodiments of the present disclosure, a semiconductor device is provided and includes: a substrate including a first side and a second side opposite to the first side; an active pattern that is on the first side and extends in a first direction; an etch stop layer that extends along the first side of the substrate and does not extend along side faces of the active pattern; a field insulating film that is on the first side and covers at least a part of the side faces of the active pattern; a gate structure that extends in a second direction intersecting the first direction on the active pattern and the field insulating film; a through contact that extends in a third direction intersecting the first direction and the second direction and penetrates the field insulating film and the etch stop layer; a buried pattern connected to the through contact, inside the substrate; and a backside wiring structure that is on the second side and electrically connected to the buried pattern.

According to embodiments of the present disclosure, a semiconductor device is provided and includes: a substrate that includes a first side and a second side that is opposite to the first side; an active pattern that is on the first side and extends in a first direction; a field insulating film that is on the first side and covers at least a part of side faces of the active pattern; an etch stop layer that is between the substrate and the field insulating film and not between the active pattern and the field insulating film; a gate structure that extends in a second direction intersecting the first direction, on the active pattern and the field insulating film; a through contact that extends in a third direction intersecting the first direction and the second direction, and penetrates the field insulating film and the etch stop layer; a buried pattern connected to the through contact, inside the substrate; and a backside wiring structure that is on the second side and electrically connected to the buried pattern.

According to embodiments of the present disclosure, a semiconductor device is provided and includes: a substrate including a first side and a second side that is opposite to the first side; an active pattern that is on the first side and extends in a first direction; an epitaxial liner film extending along the first side of the substrate and side faces of the active pattern; an etch stop layer that extends, on the epitaxial liner film, along the first side and does not extend along the side faces of the active pattern; a field insulating film that is on the etch stop layer and covers at least a part of the side faces of the active pattern; a gate structure that extends on the active pattern and the field insulating film in a second direction intersecting the first direction; a source/drain region connected to the active pattern on the side faces of the gate structure; a frontside wiring structure that is on the first side and electrically connected to the source/drain region or the gate structure; a through contact that is electrically connected to the source/drain region, and penetrates the field insulating film and the etch stop layer; a buried pattern connected to the through contact, inside the substrate; and a backside wiring structure that is on the second side and electrically connected to the buried pattern.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

BRIEF DESCRIPTION OF DRAWINGS

The above and other aspects and features of the present disclosure will become more apparent by describing in detail example embodiments with reference to the attached drawings, in which.

DETAILED DESCRIPTION

In this specification, although MBCFET® including multi-bridge channels is shown as an example of electronic elements included in a semiconductor device, this is merely an example. As another example, the semiconductor device may include a tunneling transistor (FET), a vertical FET (VFET), a complementary FET (CFET) or a three-dimensional (3D) transistor. Alternatively, the semiconductor device may include a bipolar junction transistor, a laterally diffused metal oxide semiconductor (LDMOS), or the like.

Also, in the present specification, although terms such as first and second are used to describe various elements or components, these elements or components are not limited by these terms. These terms are only used to distinguish a single element or component from other elements or components. Therefore, a first element or component referred to below may also be referred to as a second element or component according to embodiments of the present disclosure.

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

A semiconductor device according to example embodiments will be described below with reference to FIGS. 1 to 10.

Figure 1:
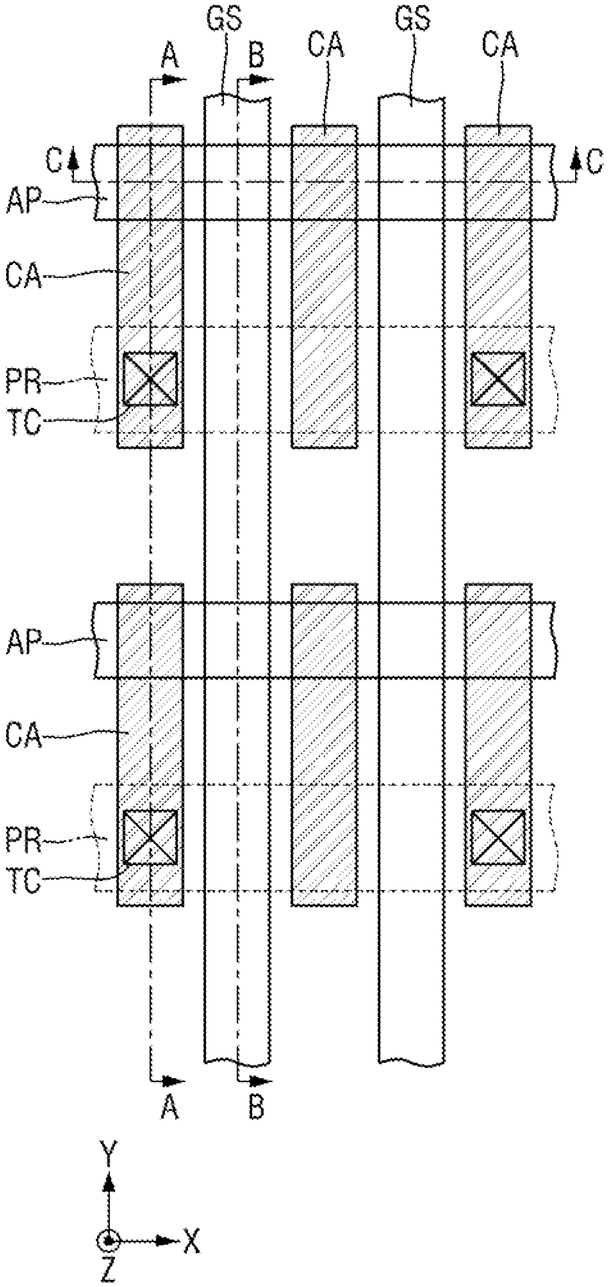
FIG. 1 is a layout diagram for explaining a semiconductor device according to one or more embodiments.
Figure 2:
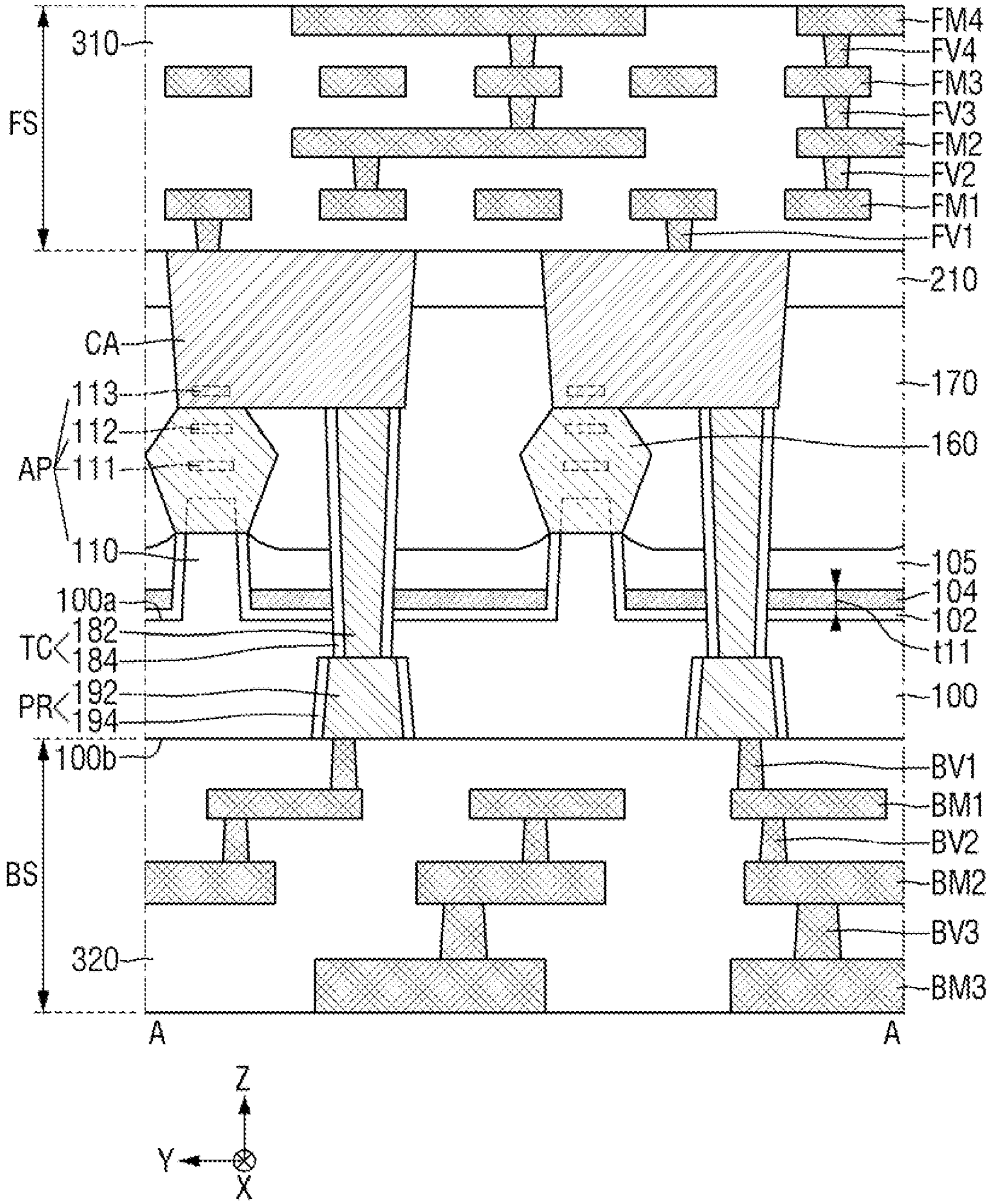
FIG. 2 is a schematic cross-sectional view taken along line A-A of FIG. 1.
Figure 3:
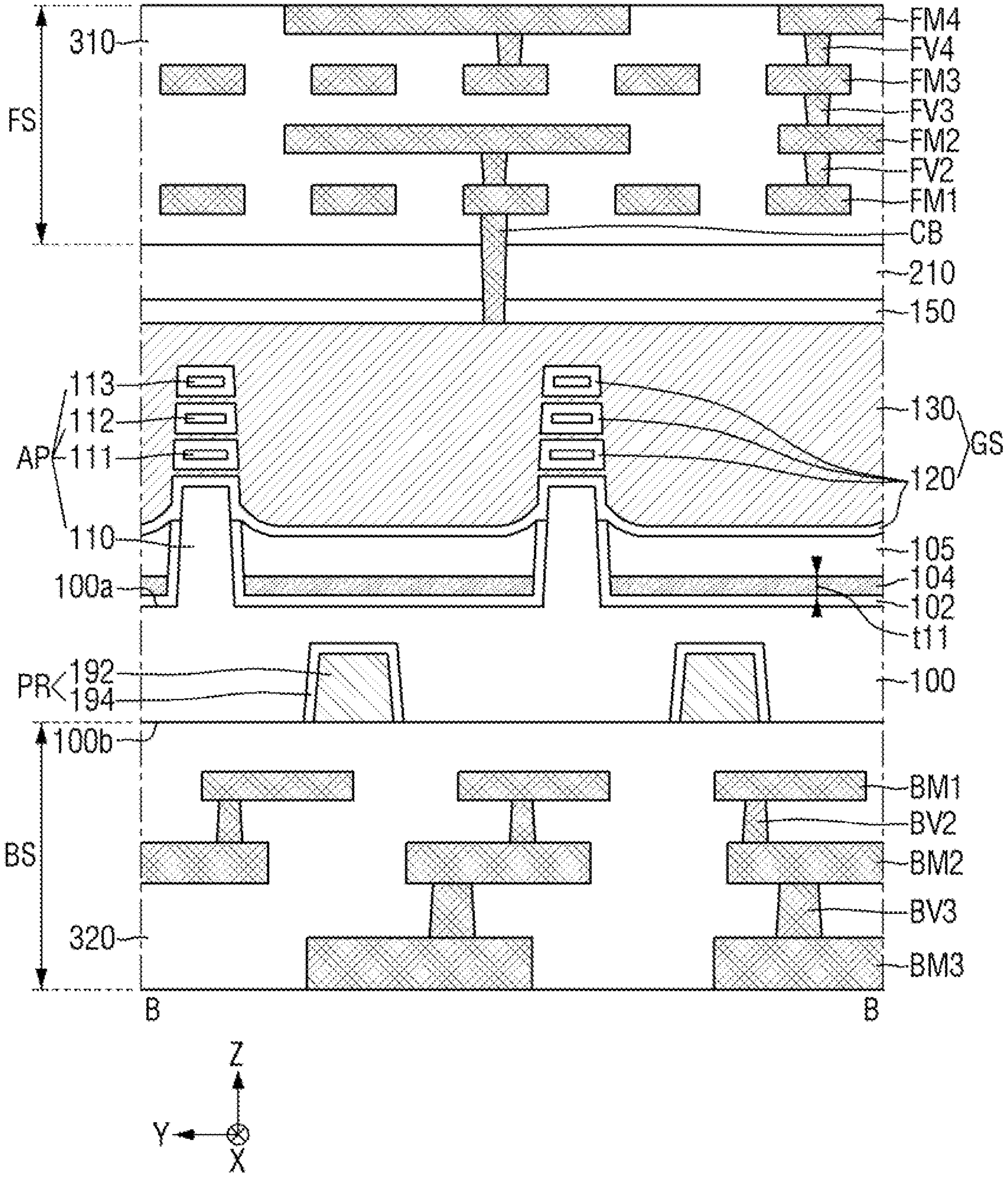
FIG. 3 is a schematic cross-sectional view taken along B-B of FIG. 1.
Figure 4:
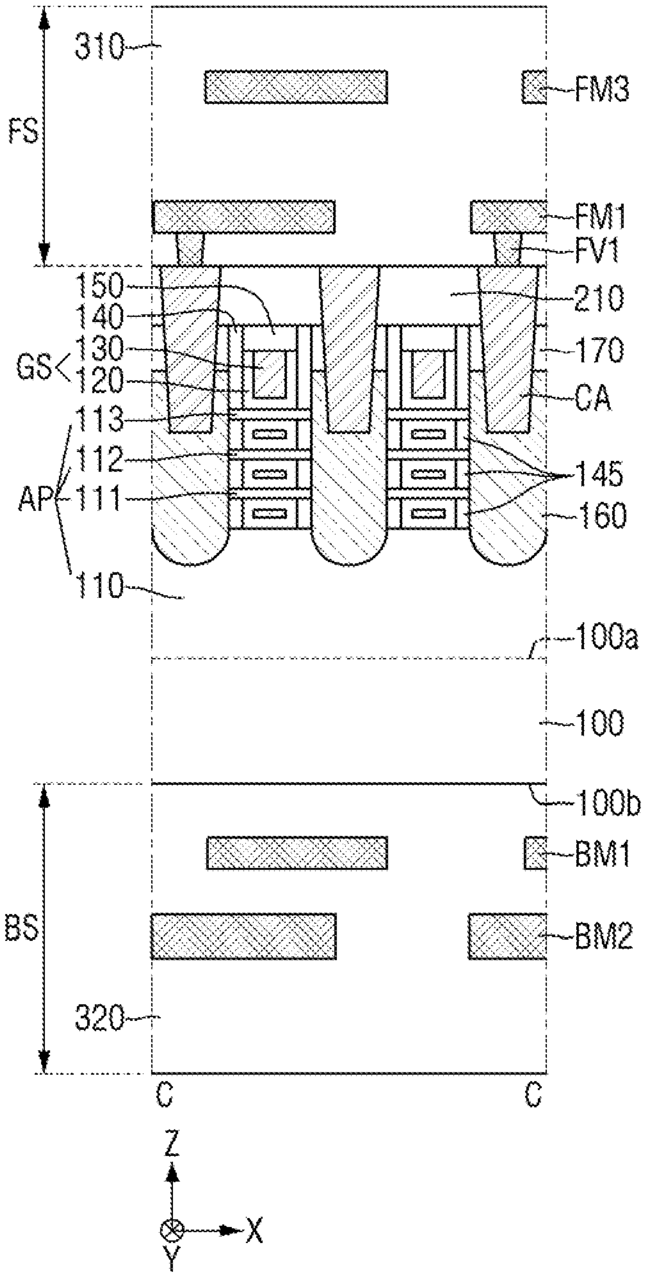
FIG. 4 is a schematic cross-sectional view taken along C-C of FIG. 1.

FIG. 1 is a layout diagram for explaining a semiconductor device according to one or more embodiments. FIG. 2 is a schematic cross-sectional view taken along line A-A of FIG. 1. FIG. 3 is a schematic cross-sectional view taken along B-B of FIG. 1. FIG. 4 is a schematic cross-sectional view taken along C-C of FIG. 1.

Referring to FIGS. 1 to 4, the semiconductor device according to one or more embodiments includes a first substrate 100, an active pattern AP, an epitaxial liner film 102, an etch stop layer 104, a field insulating film 105, a gate structure GS, a gate spacer 140, a gate capping pattern 150, a source/drain region 160, a first interlayer insulating film 170, a second interlayer insulating film 210, a frontside wiring structure FS, a through contact TC, a buried pattern PR, and a backside wiring structure BS.

The first substrate 100 may be a semiconductor substrate. For example, the first substrate 100 may be bulk silicon or silicon-on-insulator (SOI). The first substrate 100 may be a silicon substrate, or may include, but is not limited to, other materials, for example, silicon germanium, silicon germanium on insulator (SGOI), indium antimonide, lead tellurium compounds, indium arsenide, indium phosphide, gallium arsenide or gallium antimonide. For convenience of explanation, hereinafter, the first substrate 100 will be described as a silicon substrate.

The first substrate 100 may include a first side 100*a* and a second side 100*b* that are opposite to each other. The active pattern AP may be disposed on the first side 100*a* of the first substrate 100. In this specification, the first side 100*a* of the first substrate 100 on which the active pattern AP is disposed may be called a front side. Also, the second side 100*b* of the first substrate 100 opposite to the first side 100*a* may be also called a back side.

The active pattern AP may be formed on the first side 100*a* of the first substrate 100. The active pattern AP may extend long in a first direction X parallel to the first side 100*a*. Also, a plurality of the active pattern AP may extend side by side in the first direction X.

In one or more embodiments, the active pattern AP may include a first bridge pattern 111, a second bridge pattern 112, and a third bridge pattern 113 which are sequentially stacked on the first substrate 100, spaced apart from each other, and extend in the first direction X, respectively. Such an active pattern AP may be used as a channel region of an MBCFET® including the multi-bridge channels. The number of bridge patterns included in the active pattern AP is merely an example, and is not limited to the shown example.

In one or more embodiments, the active pattern AP may further include a fin pattern 110. The fin pattern 110 may protrude from the first side 100*a* of the first substrate 100 and extend in the first direction X. The first bridge pattern 111, the second bridge pattern 112, and the third bridge pattern 113 may be sequentially stacked on the upper side of the fin pattern 110.

The epitaxial liner film 102 may be formed on the first side 100*a* of the first substrate 100. The epitaxial liner film 102 may extend along at least a part of the side face of the active pattern AP. For example, as shown in FIGS. 2 and 3, the epitaxial liner film 102 may extend conformally along the first side 100*a* and a part of the side faces of the fin pattern 110. While an upper part of the fin pattern 110 is only shown to protrude beyond the uppermost side of the epitaxial liner film 102, this is merely an example. As another example, the upper side of the fin pattern 110 may be disposed on the same plane as the upper side of the epitaxial liner film 102.

In one or more embodiments, the epitaxial liner film 102 may be an epitaxial layer grown from the first substrate 100 and the active pattern AP. As an example, if the first substrate 100 is a silicon substrate, the epitaxial liner film 102 may include a silicon layer (Si layer).

The etch stop layer 104 may be formed on the first side 100*a* of the first substrate 100. For example, the etch stop layer 104 may be stacked on the epitaxial liner film 102. The etch stop layer 104 may extend along the first side 100*a* of the first substrate 100, and may not extend along the side faces of the active patterns AP. For example, as shown in FIGS. 2 and 3, the etch stop layer 104 may cover the upper side of the epitaxial liner film 102 on the first side 100*a*, and may not cover the side face of the epitaxial liner film 102 on the side face of the fin pattern 110. According to an embodiment, the etch stop layer 104 may not directly contact the fin pattern 110, and may not include a vertically extending portion that extends vertically along the fin pattern 110.

The etch stop layer 104 may have an etch selectivity different from an etch selectivity of the field insulating film 105, the first interlayer insulating film 170, and the second interlayer insulating film 210. As an example, when the field insulating film 105, the first interlayer insulating film 170, and the second interlayer insulating film 210 each include a silicon oxide layer (SiO layer), the etch stop layer 104 may include at least one from among a silicon nitride layer (SiN layer), a silicon carbonitride layer (SiCN layer), a silicon boron carbonitride layer (SiBCN layer), a silicon oxycarbide layer (SiOC layer), and an aluminum oxide layer (AlO layer). Such an etch stop layer 104 may be provided as an etch stop layer in an etching process for forming the through contact TC. This will be described more specifically in the description relating to FIGS. 24 and 25.

A thickness t11 of the etch stop layer 104 may be, for example, but is not limited to, about 1 nm to about 100 nm. According to one or more embodiments, the thickness t11 of the etch stop layer 104 may be from about 1 nm to about 20 nm.

The field insulating film 105 may be formed on the first side 100*a* of the first substrate 100. For example, the field insulating film 105 may be stacked on the etch stop layer 104. The field insulating film 105 may surround at least a part of side faces of the active pattern AP. For example, as shown in FIGS. 2 and 3, the field insulating film 105 may cover the upper side of the etch stop layer 104 and the side faces of the epitaxial liner film 102 on the side faces of the fin pattern 110.

In one or more embodiments, the field insulating film 105 may include a concave upper side. For example, as shown in FIGS. 2 and 3, a height of the upper side of the field insulating film 105 may decrease and then be constant, as it moves away from the fin pattern 110. Although the upper part of the fin pattern 110 is only shown to protrude from the upper side of the field insulating film 105, this is merely an example. As another example, the upper side of the fin pattern 110 may be disposed on the same plane as the upper side of the field insulating film 105.

The field insulating film 105 may include, for example, but is not limited to, at least one from among silicon oxide ($SiO_2$), silicon oxynitride (SiON), silicon oxycarbonitride (SiOCN), and combinations thereof. As an example, the field insulating film 105 may include a silicon oxide layer (SiO layer).

The gate structure GS may be formed on the active pattern AP and the field insulating film 105. The gate structure GS may intersect the active pattern AP. For example, the gate structure GS may extend in a second direction Y that is parallel to the first side 100*a* and intersects the first direction X.

In one or more embodiments, at least a part of the active pattern AP may extend in the first direction X and penetrate the gate structure GS. For example, the first bridge pattern 111, the second bridge pattern 112, and the third bridge pattern 113 may each extend in the first direction X and penetrate the gate structure GS. The gate structure GS may surround each of the first bridge pattern 111, the second bridge pattern 112, and the third bridge pattern 113.

The gate structure GS may include a gate dielectric film 120 and a gate electrode 130. The gate dielectric film 120 and the gate electrode 130 may be sequentially stacked on the active pattern AP.

The gate dielectric film 120 may be stacked on the active pattern AP. For example, the gate dielectric film 120 may extend along the upper side and side faces of the active pattern AP and the upper side of the field insulating film 105. Also, the gate dielectric film 120 may surround at least apart of the active pattern AP. For example, the gate dielectric film 120 may extend along the periphery of each of the first bridge pattern 111, the second bridge pattern 112, and the third bridge pattern 113.

The gate dielectric film 120 may include, for example, at least one from among, for example, silicon oxide, silicon oxynitride, silicon nitride, and a high dielectric constant material having a dielectric constant greater than a dielectric constant of silicon oxide. The high dielectric constant material may include, for example, but is not limited to, at least one from among hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), and combinations thereof.

The semiconductor device according to one or more embodiments may include a negative capacitance (NC) FET that uses a negative capacitor. For example, the gate dielectric film 120 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance values, a transistor including the ferroelectric material film may have a subthreshold swing (SS) below 60 mV/decade at room temperature.

The ferroelectric material film may have ferroelectric properties. The ferroelectric material film may include, for example, at least one from among hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include at least one from among aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which ferroelectric material is included in the ferroelectric material film.

When the ferroelectric material film includes hafnium oxide, the dopant included in the ferroelectric material film may include, for example, at least one from among gadolinium (Gd), silicon (Si), zirconium (Zr), aluminum (Al), and yttrium (Y).

When the dopant is aluminum (Al), the ferroelectric material film may include 3 to 8 atomic % (at %) aluminum. Here, a ratio of the dopant may be a ratio of aluminum to the sum of hafnium and aluminum.

When the dopant is silicon (Si), the ferroelectric material film may include 2 at % to 10 at % silicon. When the dopant is yttrium (Y), the ferroelectric material film may include 2 at % to 10 at % yttrium. When the dopant is gadolinium (Gd), the ferroelectric material film may include 1 at % to 7 at % gadolinium. When the dopant is zirconium (Zr), the ferroelectric material film may include 50 at % to 80 at % zirconium.

The paraelectric material film may have paraelectric properties. The paraelectric material film may include at least one from among, for example, a silicon oxide and a metal oxide having a high dielectric constant. The metal oxide included in the paraelectric material film may include, for example, but is not limited to, at least one from among hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Since a critical thickness that exhibits the ferroelectric properties may differ for each ferroelectric material, the thickness of the ferroelectric material film may vary depending on the ferroelectric material.

As an example, the gate dielectric film 120 may include one ferroelectric material film. As another example, the gate dielectric film 120 may include a plurality of ferroelectric material films spaced apart from one another. The gate dielectric film 120 may have a stacked layer structure in which a plurality of ferroelectric material films and a plurality of paraelectric material films are alternately stacked.

The gate electrode 130 may be stacked on the gate dielectric film 120. That is, the gate dielectric film 120 may be interposed between the active pattern AP and the gate electrode 130. Also, the gate dielectric film 120 may be interposed between the field insulating film 105 and the gate electrode 130. The gate electrode 130 may be formed by, for example, but is not limited to, a replacement process.

Although the gate electrode 130 is only shown to be a single layer, this is merely an example, and the gate electrode 130 may be formed by a plurality of conductive films. For example, the gate electrode 130 may include a work function adjusting film that adjusts a work function, and a filling conductive film that fills a space formed by the work function adjusting film. The work function adjusting film may include, for example, but is not limited to, at least one from among TiN, TaN, TiC, TaC, TiAlC, and combinations thereof. The filling conductive film may include, for example, but is not limited to, W or Al.

A gate spacer 140 may be formed on the first substrate 100 and the field insulating film 105. The gate spacer 140 may extend along the side faces of the gate electrode 130. In one or more embodiments, a part of the gate dielectric film 120 may be interposed between the gate electrode 130 and the gate spacer 140. For example, the gate dielectric film 120 may further extend along the inner side face of the gate spacer 140. The gate dielectric film 120 may be formed by, but is not limited to, a replacement process.

The gate spacer 140 may include, for example, but is not limited to, at least one from among silicon nitride, silicon oxynitride, silicon oxycarbide, silicon boron nitride, silicon boron carbonitride, silicon oxycarbonitride, and combinations thereof. As an example, the gate spacer 140 may include a silicon nitride layer.

The gate capping pattern 150 may be formed on the gate structure GS. The gate capping pattern 150 may extend along the upper face of the gate structure GS. Although the upper side of the gate capping pattern 150 is only shown as being disposed on the same plane as the upper side of the gate spacer 140, this is merely an example. As another example, the gate capping pattern 150 may cover the upper side of the gate spacer 140.

The gate capping pattern 150 may include an insulating material, for example, but is not limited to, at least one from among silicon nitride, silicon oxynitride, silicon oxycarbide, silicon boron nitride, silicon boron carbonitride, silicon oxycarbonitride, and combinations thereof. As an example, the gate capping pattern 150 may include a silicon nitride layer.

The source/drain region 160 may be formed on at least one side face (e.g., both side faces) of the gate structure GS. Also, the source/drain region 160 may be connected to the active pattern AP. For example, the upper side of the fin pattern 110 may be connected to the source/drain region 160. Also, the first bridge pattern 111, the second bridge pattern 112, and the third bridge pattern 113 may each penetrate the gate structure GS and the gate spacer 140, and be connected to the source/drain region 160. The source/drain region 160 may be electrically separated from the gate electrode 130 by the gate dielectric film 120 and/or the gate spacer 140. Such a source/drain region 160 may be provided as a source or a drain of a field effect transistor including the active pattern AP and the gate structure GS.

In one or more embodiments, the source/drain region 160 may include an epitaxial layer. For example, the source/drain region 160 may be an epitaxial pattern formed by an epitaxial growth process. As shown in FIG. 2, the cross-section of each of a plurality of the source/drain region 160 intersecting the first direction X may be hexagonal, but this is merely an example. According to one or more embodiments, a cross-section of each source/drain region 160 intersecting the first direction X may have various shapes such as a pentagonal shape and a diamond shape, depending on the epitaxial growth conditions.

If the field effect transistor including the active pattern AP and the gate structure GS is an NFET, the source/drain region 160 may include n-type impurities or impurities for preventing diffusion of the n-type impurities. For example, the source/drain region 160 may include at least one from among P, Sb, As, and combinations thereof.

In one or more embodiments, the source/drain region 160 may include a tensile stress material. As an example, if the active pattern AP is a silicon (Si) pattern, the source/drain regions 160 may include a material with a smaller lattice constant than a lattice constant of silicon (Si) (e.g., silicon carbide (SiC)). The tensile stress material may improve carrier mobility of the channel region by applying the tensile stress to the active pattern AP.

If the field effect transistor including the active pattern AP and the gate structure GS is a PFET, the source/drain region 160 may include p-type impurities or impurities for preventing diffusion of the p-type impurities. For example, the source/drain region 160 may include at least one from among B, C, In, Ga, Al, and combinations thereof.

In one or more embodiments, the source/drain region 160 may include a compressive stress material. As an example, if the active pattern AP is a silicon (Si) pattern, the source/drain regions 160 may include a material (e.g., silicon germanium (SiGe)) having a lattice constant greater than a lattice constant of silicon (Si). The compressive stress material may improve carrier mobility of the channel region, by applying the compressive stress to the active pattern AP.

In one or more embodiments, one or more of an inner spacer 145 may be further formed on the side faces of the gate electrode 130. The one or more of the inner spacer 145 may be formed on the side faces of the gate electrode 130 between the first bridge pattern 111, the second bridge pattern 112, and the third bridge pattern 113. Also, the one or more of the inner spacer 145 may be formed on the side face of the gate electrode 130 between the fin pattern 110 and the first bridge pattern 111. The gate electrode 130 may be electrically separated from the source/drain region 160 by the gate dielectric film 120, the gate spacer 140, and/or the inner spacer 145. In some other embodiments, the inner spacer 145 may be omitted.

The inner spacer 145 may include, for example, but is not limited to, at least one from among silicon nitride, silicon oxynitride, silicon oxycarbide, silicon boron nitride, silicon boron carbonitride, silicon oxycarbonitride, and combinations thereof. As an example, the inner spacer 145 may include a silicon nitride layer. The inner spacer 145 may include the same material as the gate spacer 140 or may include a different material from the gate spacer 140. Although a thickness of the inner spacer 145 is only shown as being the same as the thickness of each gate spacer 140, this is merely an example.

The first interlayer insulating film 170 may be formed to fill the space on the outer side face of the gate spacer 140. For example, the first interlayer insulating film 170 may cover the field insulating film 105 and the source/drain region 160.

A second interlayer insulating film 210 may be formed on the first interlayer insulating film 170. For example, the second interlayer insulating film 210 may cover the upper side of the first interlayer insulating film 170, the upper side of the gate spacer 140, and the upper side of the gate capping pattern 150.

The first interlayer insulating film 170 and the second interlayer insulating film 210 may include, for example, but are not limited to, at least one from among silicon oxide, silicon nitride, silicon oxynitride, silicon oxycarbide, silicon boron nitride, silicon boron carbonitride, silicon oxycarbonitride, and a low dielectric constant material having a lower dielectric constant than silicon oxide. The low dielectric constant material may include, for example, but is not limited to, at least one from among Flowable Oxide (FOX), Torene SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, and combinations thereof.

The frontside wiring structure FS may be disposed on the first side 100*a* of the first substrate 100. For example, the frontside wiring structure FS may be formed on the upper side of the second interlayer insulating film 210. The frontside wiring structure FS may include a frontside inter-wiring insulating film 310, a plurality of frontside wiring patterns FM1, FM2, FM3, and FM4, and a plurality of frontside via patterns FV1, FV2, FV3, and FV4. The frontside wiring patterns FM1, FM2, FM3, and FM4 may be sequentially stacked on the second interlayer insulating film 210. The frontside via patterns FV1, FV2, FV3, and FV4 may be sequentially stacked on the second interlayer insulating film 210. The frontside via patterns FV1, FV2, FV3, and FV4 may interconnect the frontside wiring patterns FM1, FM2, FM3, and FM4. The frontside wiring patterns FM1, FM2, FM3, and FM4 and the frontside via patterns FV1, FV2, FV3, and FV4 may be formed inside the frontside inter-wiring insulating film 310. The frontside wiring patterns FM1, FM2, FM3, and FM4 and the frontside via patterns FV1, FV2, FV3, and FV4 may be insulated from each other by the frontside inter-wiring insulating film 310, respectively. The number of layers, the number, the placement and the like of the frontside inter-wiring insulating film 310, the frontside wiring patterns FM1, FM2, FM3, and FM4, and the frontside via patterns FV1, FV2, FV3, and FV4 are merely examples, and are not limited to those shown in the drawings.

In one or more embodiments, the widths of each of the frontside via patterns FV1, FV2, FV3, and FV4 may decrease toward the first side 100*a* of the first substrate 100. This may be due to the characteristics of the etching process for forming the frontside via patterns FV1, FV2, FV3, and FV4.

The frontside wiring structure FS may provide a signal line and/or a power supply line for various electronic elements (e.g., a field effect transistor including the active pattern AP and the gate structure GS) formed on the first side 100*a* of the first substrate 100. For example, the source/drain contact CA may be formed on the source/drain region 160. The source/drain contact CA may penetrate the first interlayer insulating film 170 and the second interlayer insulating film 210, and be connected to the source/drain region 160. A first frontside via pattern FV1 of the frontside wiring structure FS may be connected to the source/drain contact CA. The frontside wiring structure FS may be electrically connected to the source/drain region 160 accordingly.

In one or more embodiments, a gate contact CB may be formed on the gate structure GS. The gate contact CB penetrates the second interlayer insulating film 210, the first interlayer insulating film 170 and the gate capping pattern 150, and may be connected to the gate electrode 130. The gate contact CB may connect the gate electrode 130 and the first frontside wiring pattern FM1. Therefore, the frontside wiring structure FS may be electrically connected to the gate electrode 130. Unlike the shown example, in some other embodiments, the gate contact CB may connect the gate electrode 130 and the first frontside via pattern FV1.

Although not specifically shown, the frontside wiring patterns FMT, FM2, FM3, and FM4 and the frontside via patterns FV1, FV2, FV3, and FV4 may each include a barrier conductive film and a filling conductive film. The barrier conductive film may include a metal or metal nitride for preventing diffusion of the filling conductive film. The barrier conductive film may include, for example, but is not limited to, at least one from among titanium (Ti), tantalum (Ta), tungsten (W), nickel (Ni), cobalt (Co), platinum (Pt), alloys thereof, and nitrides thereof. The filling conductive film may include, for example, but is not limited to, at least one from among aluminum (Al), copper (Cu), tungsten (W), molybdenium (Mo), cobalt (Co), ruthenium (Ru), and alloys thereof.

In one or more embodiments, the width of each of the source/drain contact CA and the gate contact CB may decrease toward the first side 100*a* of the first substrate 100. This may be due to the characteristics of the etching process for forming the source/drain contact CA and the gate contact CB.

The through contact TC may extend in a third direction Z that intersects the first direction X and the second direction Y, and penetrate the epitaxial liner film 102, the etch stop layer 104, and the field insulating film 105. The through contact TC may be connected to the first substrate 100. For example, the lower side of the through contact TC may be formed to be lower than or equal to the first side 100*a* of the first substrate 100.

The through contact TC may be electrically connected to various electronic elements (e.g., the field effect transistor including the active pattern AP and the gate structure GS) formed on the first side 100*a* of the first substrate 100. As an example, the through contact TC may be connected to the source/drain region 160.

In one or more embodiments, the through contact TC may be connected to the source/drain contact CA. For example, the through contact TC may be connected to the lower side of the source/drain contact CA. The through contact TC may be electrically connected to the source/drain region 160 accordingly.

In one or more embodiments, the through contact TC may include a through conductive film 182 and a through spacer 184. The through conductive film 182 may include, for example, but is not limited to, at least one from among aluminum (Al), copper (Cu), tungsten (W), molybdenium (Mo), cobalt (Co), ruthenium (Ru), and alloys thereof. The through spacer 184 may surround the side faces of the through conductive film 182. The through spacer 184 may include an insulating material for electrically separating the through conductive film 182 from the first substrate 100. For example, the through spacer 184 may include, but is not limited to, at least one from among silicon oxide, silicon nitride, silicon oxynitride, silicon oxycarbonitride, and combinations thereof.

In one or more embodiments, the width of the through contact TC may gradually decrease in a direction (e.g., –Z direction) from the frontside wiring structure FS toward the backside wiring structure BS. This may be due to the fact that the etching process for forming the through contact TC is performed on the first side 100*a* of the first substrate 100.

According to one or more embodiments, the shape of the through contact TC is not limited to the shown example, and may vary from a planar point of view (for example, in an XY plane), such as a circular shape, a square shape or other polygonal shapes. Alternatively, the through contact TC may also have a shape extending in one direction (e.g., the first direction X) from a planar point of view (e.g., the XY plane).

The buried pattern PR may be formed inside the first substrate 100. The buried pattern PR may be connected to the through contact TC. For example, the upper side of the buried pattern PR may be connected to the lower part of the through contact TC penetrating the first side 100*a* of the first substrate 100. Accordingly, the buried pattern PR may be electrically connected to various electronic elements (e.g., the field effect transistor including the active pattern AP and the gate structure GS) formed on the first side 100*a* of the first substrate 100. As an example, the buried pattern PR may be electrically connected to the source/drain region 160.

In one or more embodiments, the buried pattern PR may include a buried conductive film 192 and a buried spacer 194. The buried conductive film 192 may include, for example, but is not limited to, at least one from among aluminum (Al), copper (Cu), tungsten (W), molybdenium (Mo), cobalt (Co), ruthenium (Ru), and alloys thereof. The buried spacer 194 may surround the side faces of the buried conductive film 192. The buried spacer 194 may include an insulating material for electrically separating the buried conductive film 192 from the first substrate 100. For example, the buried spacer 194 may include, but is not limited to, at least one from among silicon oxide, silicon nitride, silicon oxynitride, silicon oxycarbonitride, and combinations thereof.

In one or more embodiments, a width of the buried pattern PR may gradually decrease in the direction (e.g., a Z direction) from the second side 100*b* of the first substrate 100 toward the first side 100*a* of the first substrate 100. This may be due to the fact that the etching process for forming the buried pattern PR is performed on the second side 100*b* of the first substrate 100.

The backside wiring structure BS may be disposed on the second side 100*b* of the first substrate 100. The backside wiring structure BS may include a backside inter-wiring insulating film 320, a plurality of backside wiring patterns BM1, BM2, and BM3, and a plurality of backside via patterns BV1, BV2, and BV3. The backside wiring patterns BM1, BM2, and BM3 may be sequentially stacked on the second side 100*b* of the first substrate 100. The backside via patterns BV1, BV2, and BV3 may be sequentially stacked on the second side 100*b* of the first substrate 100. The backside via patterns BV1, BV2, and BV3 may interconnect the backside wiring patterns BM1, BM2, and BM3. The backside wiring patterns BM1, BM2, and BM3 and the backside via patterns BV1, BV2, and BV3 may be formed inside the backside inter-wiring insulating film 320. The backside wiring patterns BM1, BM2, and BM3 and the backside via patterns BV1, BV2, and BV3 may be insulated from each other by the backside inter-wiring insulating film 320. The number of layers, number, placement and the like of the backside inter-wiring insulating film 320, the backside wiring patterns BM1, BM2, and BM3, and the backside via patterns BV1, BV2, and BV3 are merely examples, and are not limited to the shown example.

In one or more embodiments, the width of each of the backside via patterns BV1, BV2, and BV3 may decrease toward the second side 100*b* of the first substrate 100. This may be due to the characteristics of the etching process for forming the backside via patterns BV1, BV2, and BV3.

In one or more embodiments, the backside wiring structure BS may provide a power delivery network (PDN) for various electronic elements (e.g., field effect transistor including the active pattern AP and gate structure GS) formed on the first side 100*a* of the first substrate 100. For example, the backside wiring structure BS may be electrically connected to the buried pattern PR. A power supply voltage (for example, a source voltage or a drain voltage) supplied from the outside may be transferred to the uppermost wiring (for example, a third backside wiring pattern BM3) of the backside wiring structure BS, and may be provided to the source/drain region 160 through the buried pattern PR, the through contact TC, and the source/drain contact CA.

In one or more embodiments, the buried pattern PR may extend in the first direction X from a planar point of view. Such a buried pattern PR may be provided as a power rail for various electronic elements (e.g., the field effect transistor including the active pattern AP and the gate structure GS) formed on the first side 100*a* of the first substrate 100.

Although it is not specifically shown, the backside wiring patterns BM1, BM2, and BM3 and the backside via patterns BV1, BV2, and BV3 may each include a barrier conductive film and a filling conductive film. The barrier conductive film may include a metal or metal nitride for preventing diffusion of the filling conductive film. The barrier conductive film may include, for example, but is not limited to, at least one from among titanium (Ti), tantalum (Ta), tungsten (W), nickel (Ni), cobalt (Co), platinum (Pt), alloys thereof, and nitrides thereof. The filling conductive film may include, for example, but is not limited to, at least one from among aluminum (Al), copper (Cu), tungsten (W), molybdenium (Mo), cobalt (Co), ruthenium (Ru), and alloys thereof.

FIGS. 5 to 8 are various schematic cross-sectional views for explaining the semiconductor device according to one or more embodiments. For convenience of explanation, repeated parts of the contents explained above with reference to FIGS. 1 to 4 will be briefly explained or omitted. For reference, FIGS. 5 to 8 are other schematic cross-sectional views taken along line A-A of FIG. 1, respectively.

Figure 5:
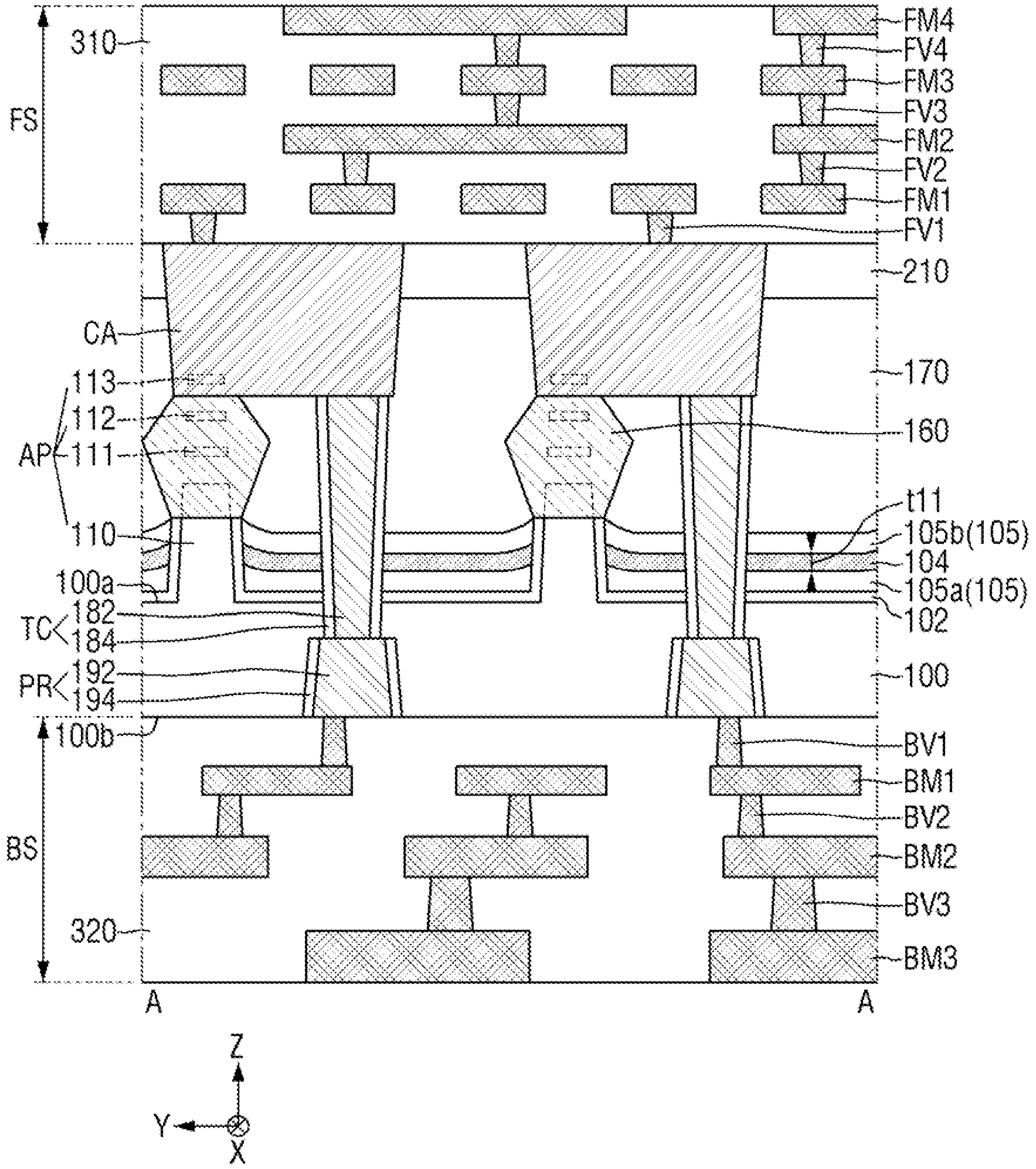
FIG. 5 is a schematic cross-sectional view for explaining a semiconductor device according to one or more embodiments.

Referring to FIG. 5, in the semiconductor device according to one or more embodiments, the etch stop layer 104 is formed inside the field insulating film 105.

For example, the field insulating film 105 may include a first insulating film 105*a* and a second insulating film 105*b* that are sequentially stacked on the first side 100*a* of the first substrate 100. The etch stop layer 104 may be interposed between the first insulating film 105*a* and the second insulating film 105*b*. The etch stop layer 104 may extend along the upper side of the first insulating film 105*a*, and the second insulating film 105*b* may extend along the upper side of the etch stop layer 104.

In one or more embodiments, the first insulating film 105*a* may include a concave upper side. For example, as shown, the height of the upper side of the first insulating film 105*a* may decrease and then be constant as it moves away from the fin pattern 110. In such a case, the etch stop layer 104 extending along the upper side of the first insulating film 105*a* may also include a concave upper side, and the second insulating film 105*b* extending along the upper side of the etch stop layer 104 may also include a concave upper side.

Figure 6:
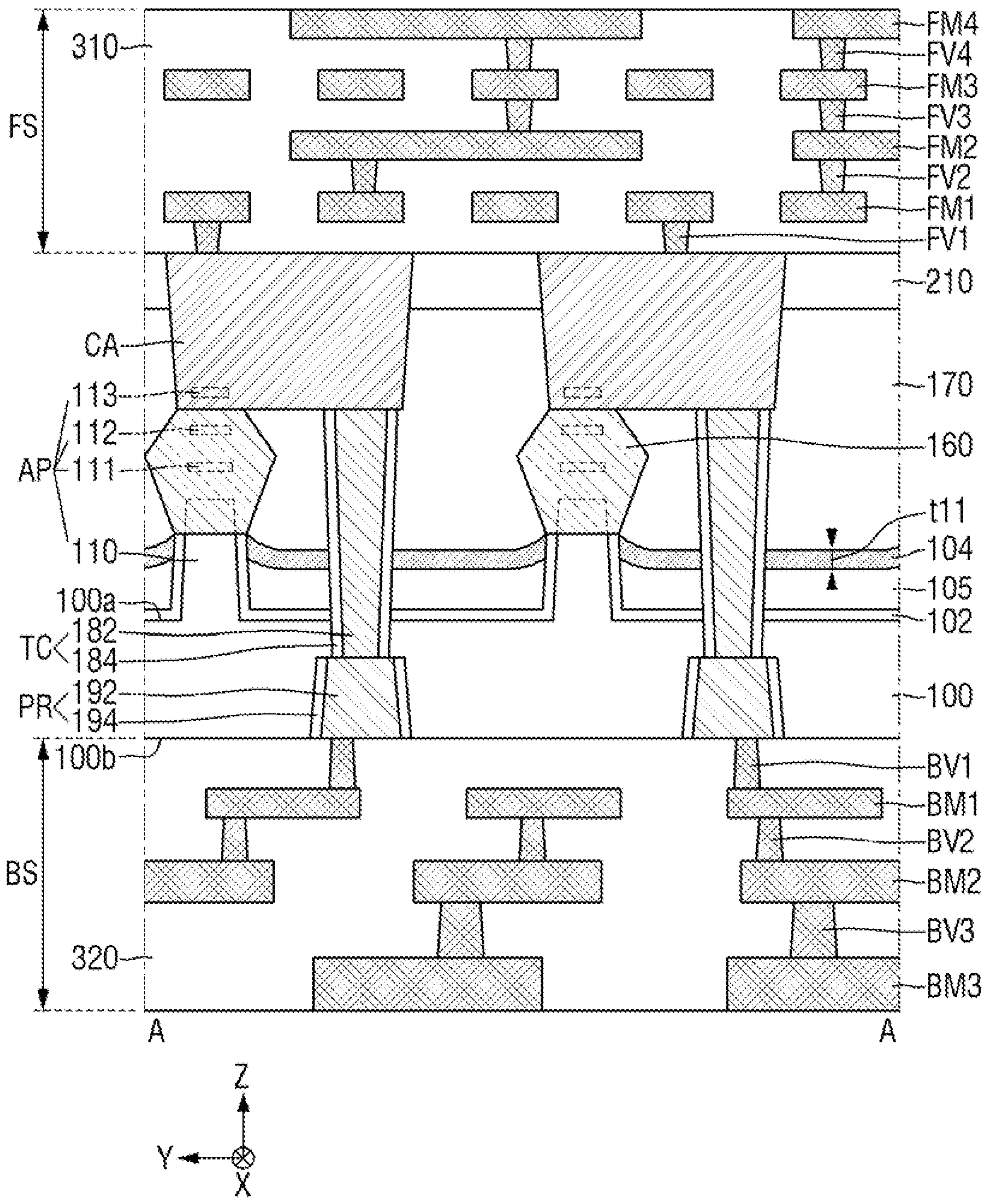
FIG. 6 is a schematic cross-sectional view for explaining a semiconductor device according to one or more embodiments.

Referring to FIG. 6, in the semiconductor device according to one or more embodiments, the etch stop layer 104 is formed on the field insulating film 105.

For example, the field insulating film 105 and the etch stop layer 104 may be sequentially stacked on the epitaxial liner film 102. The etch stop layer 104 may extend along the upper side of the field insulating film 105.

In one or more embodiments, the field insulating film 105 may include a concave upper side. For example, as shown, the height of the upper side of the field insulating film 105 may decrease and then be constant as it moves away from the fin pattern 110. In this case, the etch stop layer 104 extending along the upper side of the field insulating film 105 may also include a concave upper side.

Figure 7:
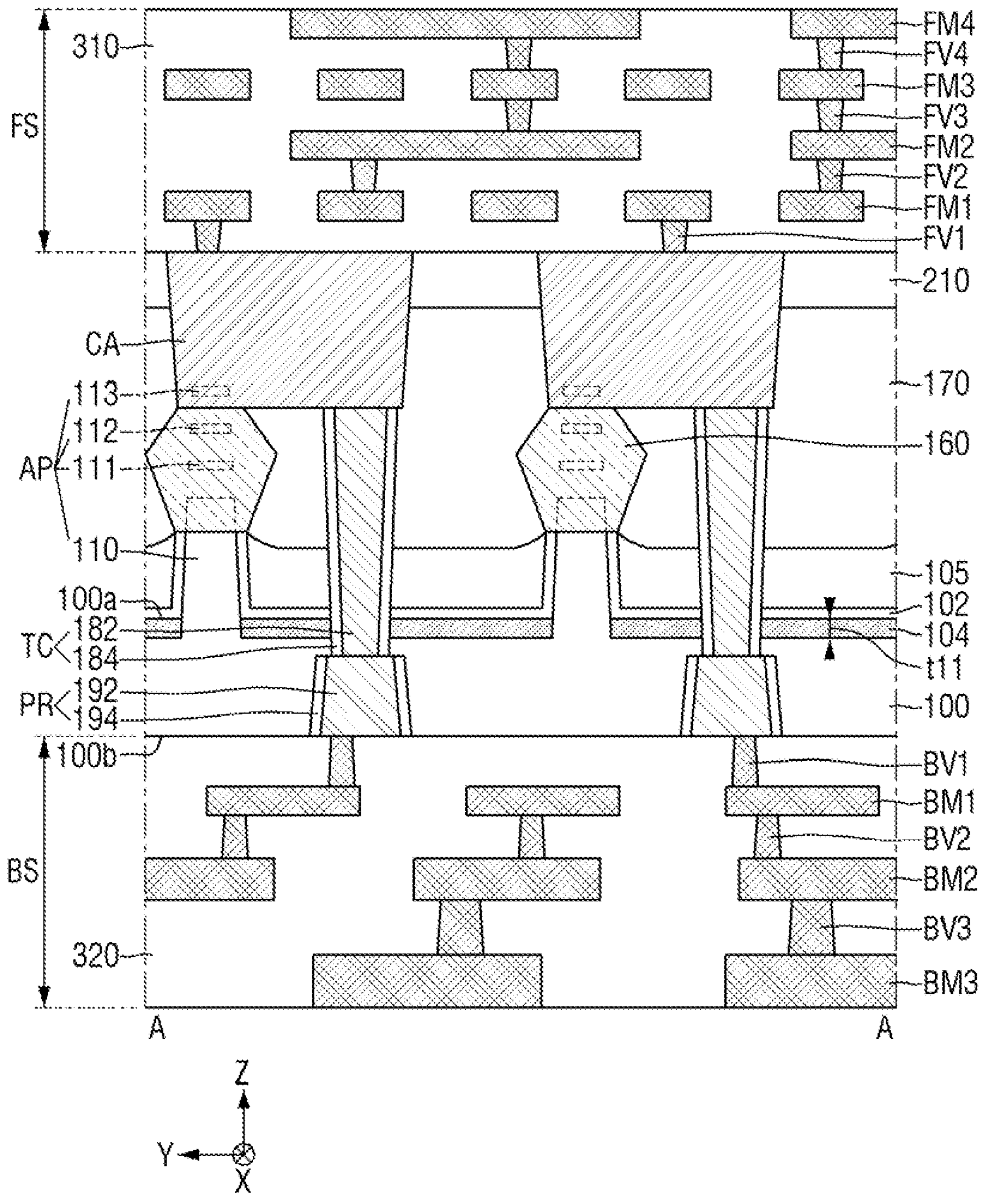
FIG. 7 is a schematic cross-sectional view for explaining a semiconductor device according to one or more embodiments.

Referring to FIG. 7, in the semiconductor device according to one or more embodiments, the etch stop layer 104 is formed under the field insulating film 105.

For example, the etch stop layer 104, the epitaxial liner film 102, and the field insulating film 105 may be sequentially stacked on the first side 100*a* of the first substrate 100. The etch stop layer 104 may be interposed between the first substrate 100 and the epitaxial liner film 102. The epitaxial liner film 102 may extend along the upper side of the etch stop layer 104 and at least a part of the side faces of the active pattern AP. The field insulating film 105 may be stacked on the epitaxial liner film 102 and surround at least a part of the side faces of the active pattern AP.

Figure 8:
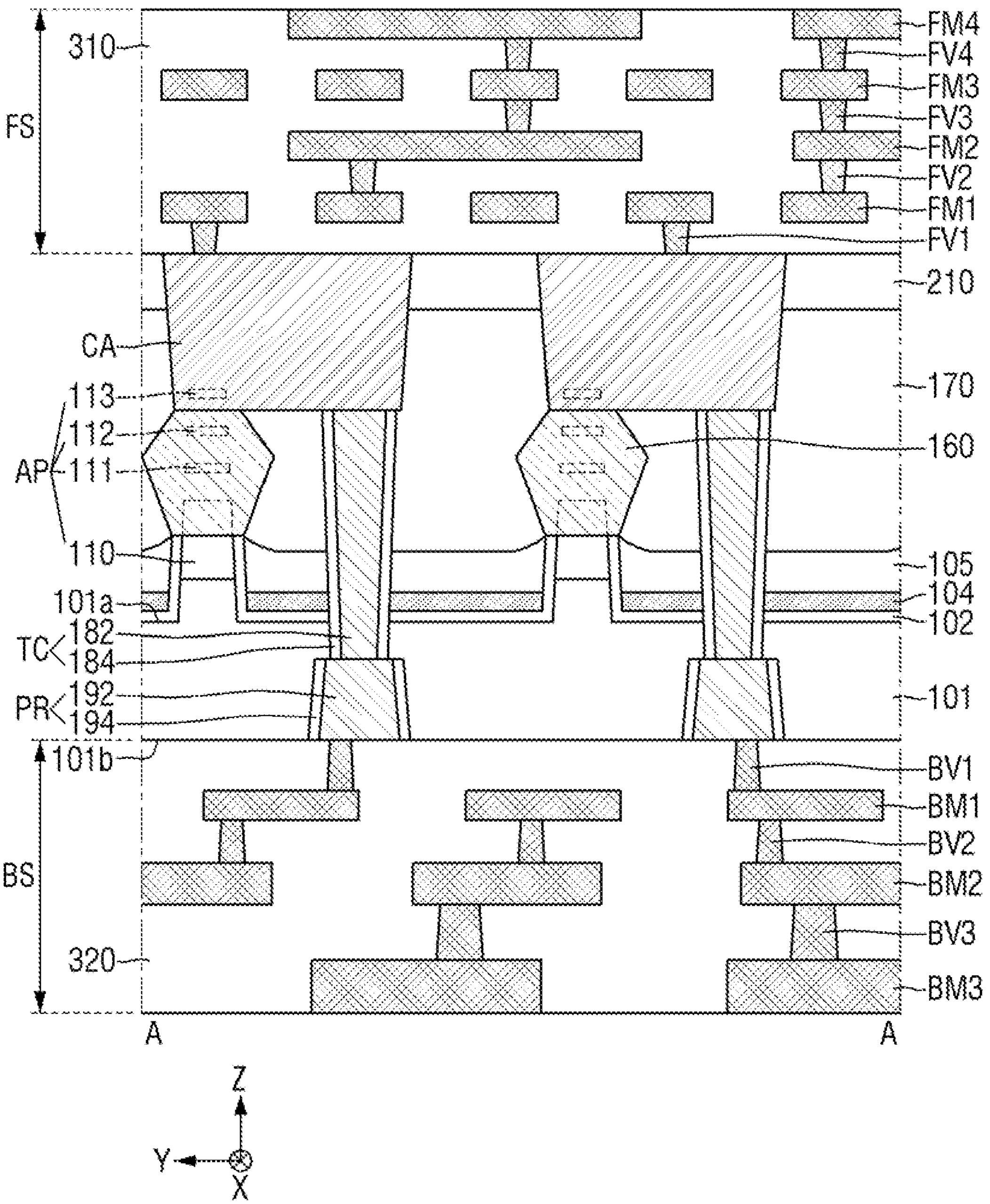
FIG. 8 is a schematic cross-sectional view for explaining a semiconductor device according to one or more embodiments.

Referring to FIG. 8, the semiconductor device according to one or more embodiments includes a second substrate 101.

The second substrate 101 may be an insulating substrate. The second substrate 101 may include, for example, but is not limited to, at least one from among silicon oxide, silicon oxynitride, silicon oxycarbonitride, and combinations thereof. In one or more embodiments, such a second substrate 101 may be formed by replacing at least a part of the semiconductor substrate (e.g., the first substrate 100 of FIG. 2).

The second substrate 101 may include a third side 101*a* and a fourth side 101*b* that are opposite to each other. The active pattern AP may be disposed on the third side 101*a* of the second substrate 101. In this specification, the third side 101*a* of the second substrate 101 on which the active patterns AP are disposed may also be referred to as the front side. Also, the fourth side 101*b* of the second substrate 101 opposite to the third side 101*a* may also be referred to as a back side.

In one or more embodiments, a part of the second substrate 101 may protrude above the lower side of the epitaxial liner film 102. For example, as shown, the second substrate 101 may include a protrusion that protrudes upward toward the active pattern AP.

Figure 9:
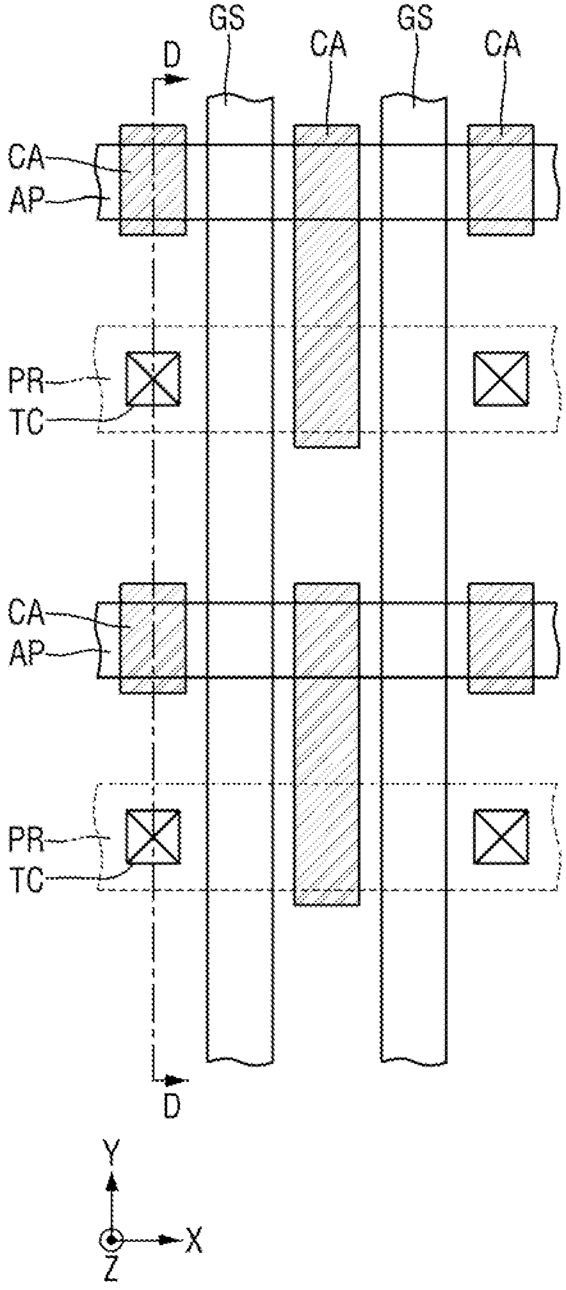
FIG. 9 is a layout diagram for explaining a semiconductor device according to one or more embodiments.
Figure 10:
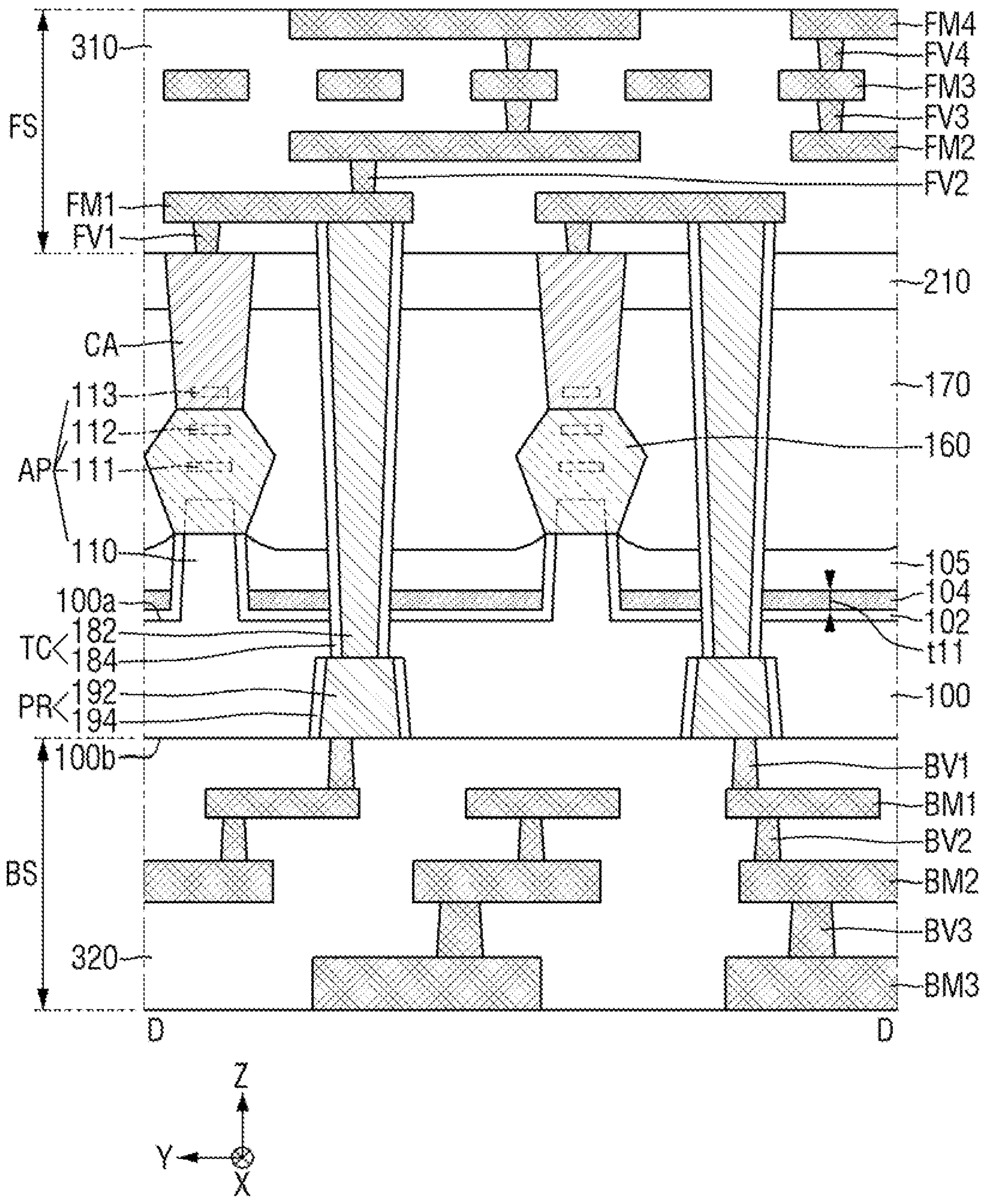
FIG. 10 is a schematic cross-sectional view taken along D-D of FIG. 9.

FIG. 9 is a layout diagram for explaining a semiconductor device according to one or more embodiments. FIG. 10 is a schematic cross-sectional view taken along D-D of FIG. 9. For convenience of explanation, repeated parts of the contents explained above with reference to FIGS. 1 to 4 will be briefly explained or omitted.

Referring to FIGS. 9 and 10, in the semiconductor device according to one or more embodiments, the through contact TC may be connected to the frontside wiring structure FS.

For example, the through contact TC may be connected to the lower side of the first frontside wiring pattern FM1. Also, the first frontside wiring pattern FM1 connected to the through contact TC may be connected to the source/drain contact CA through the first frontside via pattern FV1. The through contact TC may be electrically connected to the source/drain region 160 accordingly.

A method for fabricating a semiconductor device according to example embodiments will be described below with reference to FIGS. 1 to 46.

FIGS. 11 to 31 are intermediate step diagrams for explaining the method for fabricating the semiconductor device according to one or more embodiments. For convenience of explanation, repeated parts of the contents explained above with reference to FIGS. 1 to 4 will be briefly explained or omitted.

Figure 11:
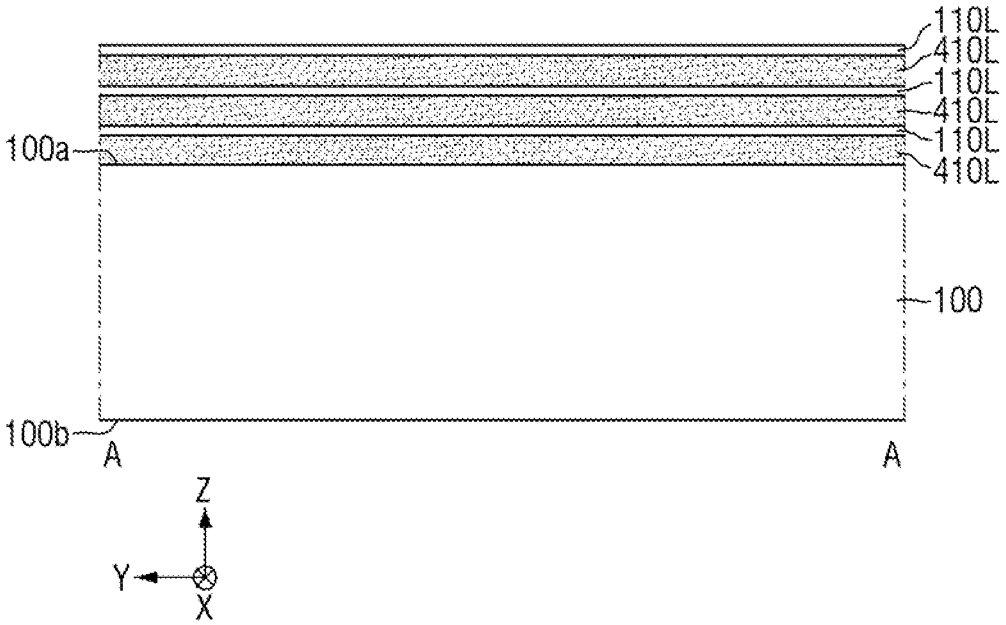
FIGS. 11 to 31 are intermediate step diagrams for explaining a method for fabricating a semiconductor device according to one or more embodiments.

Referring to FIG. 11, a plurality of sacrificial layers 410L and a plurality of active layers 110L are formed on the first substrate 100.

The first substrate 100 may be a semiconductor substrate. As an example, the first substrate 100 may be a silicon substrate. The first substrate 100 may include a first side 100*a* and a second side 100*b* that are opposite to each other.

The plurality of sacrificial layers 410L and the plurality of active layers 110L may be alternately stacked on the first side 100*a* of the first substrate 100. Each active layer 110L may include an elemental semiconductor material, for example, silicon (Si) or germanium (Ge). As an example, each of the active layers 110L may include a silicon (Si) layer. Each of the sacrificial layers 410L may have etch selectivity different from that of the active layers 110L. As an example, if each of the active layers 110L includes a silicon (Si) layer, each of the sacrificial layers 410L may include a silicon germanium (SiGe) layer.

Although FIG. 11 only shows that one of the active layers 110L is disposed at the top in the stacked structure of the sacrificial layers 410L and the active layers 110L, this is merely an example. As another example, one of the sacrificial layers 410L may be disposed at the top in the stacked structure of the sacrificial layers 410L and the active layers 110L.

Figure 12:
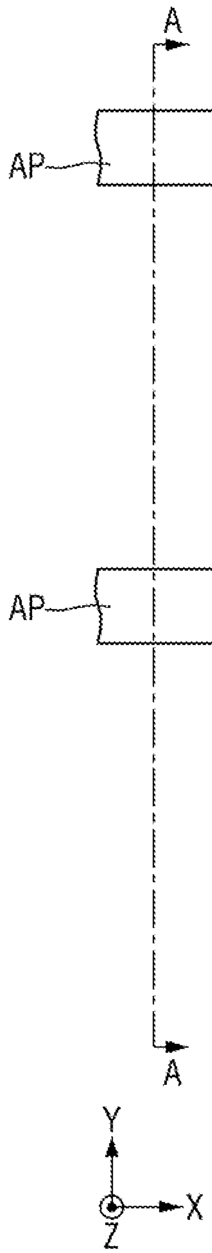
Figure 13:
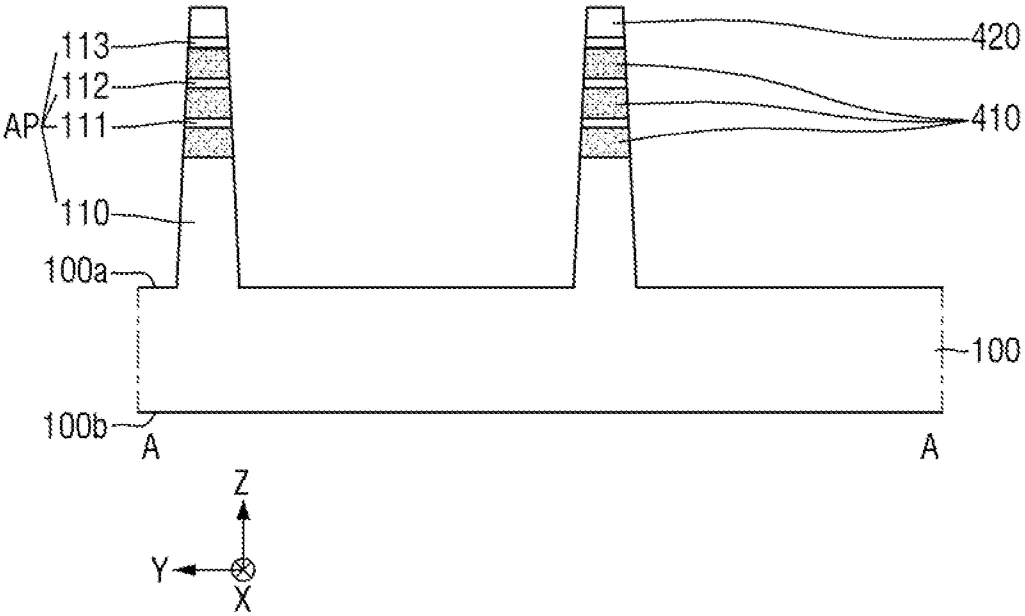

Referring to FIGS. 11 to 13, the sacrificial layers 410L and the active layers 110L are patterned. For reference, FIG. 13 is a schematic cross-sectional view taken along line A-A of FIG. 12.

For example, a mask pattern 420 extending long in the first direction X may be formed on the sacrificial layers 410L and the active layers 110L. After that, an etching process may be performed on the sacrificial layers 410L and the active layers 110L, using the mask pattern 420 as an etching mask. As a result, the active pattern AP including the first bridge pattern 111, the second bridge pattern 112, and the third bridge pattern 113 extending in the first direction X may be formed. Also, a plurality of sacrificial patterns 410 each extending in the first direction X may be formed.

In one or more embodiments, the upper part of the first substrate 100 may be patterned by the etching process. Accordingly, the active pattern AP including the fin pattern 110 may be formed.

Figure 14:
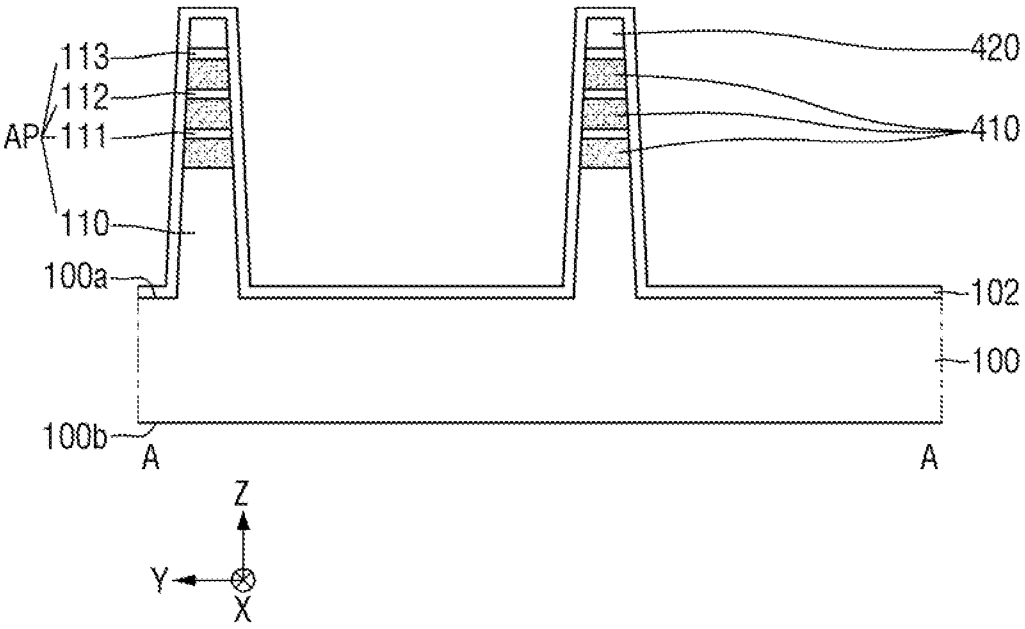

Referring to FIG. 14, an epitaxial liner film 102 is formed on the first side 100*a* of the first substrate 100.

The epitaxial liner film 102 may conformally extend along the first side 100*a* of the first substrate 100, the side faces of the active pattern AP, and the side faces of the sacrificial pattern 410.

In one or more embodiments, the epitaxial liner film 102 may be an epitaxial layer that is grown by the epitaxial growth process. As an example, the epitaxial liner film 102 may include a silicon layer (Si layer) that is grown by an epitaxial growth process that uses the first substrate 100, the active pattern AP, and/or the sacrificial pattern 410 as seed layers.

Figure 15:
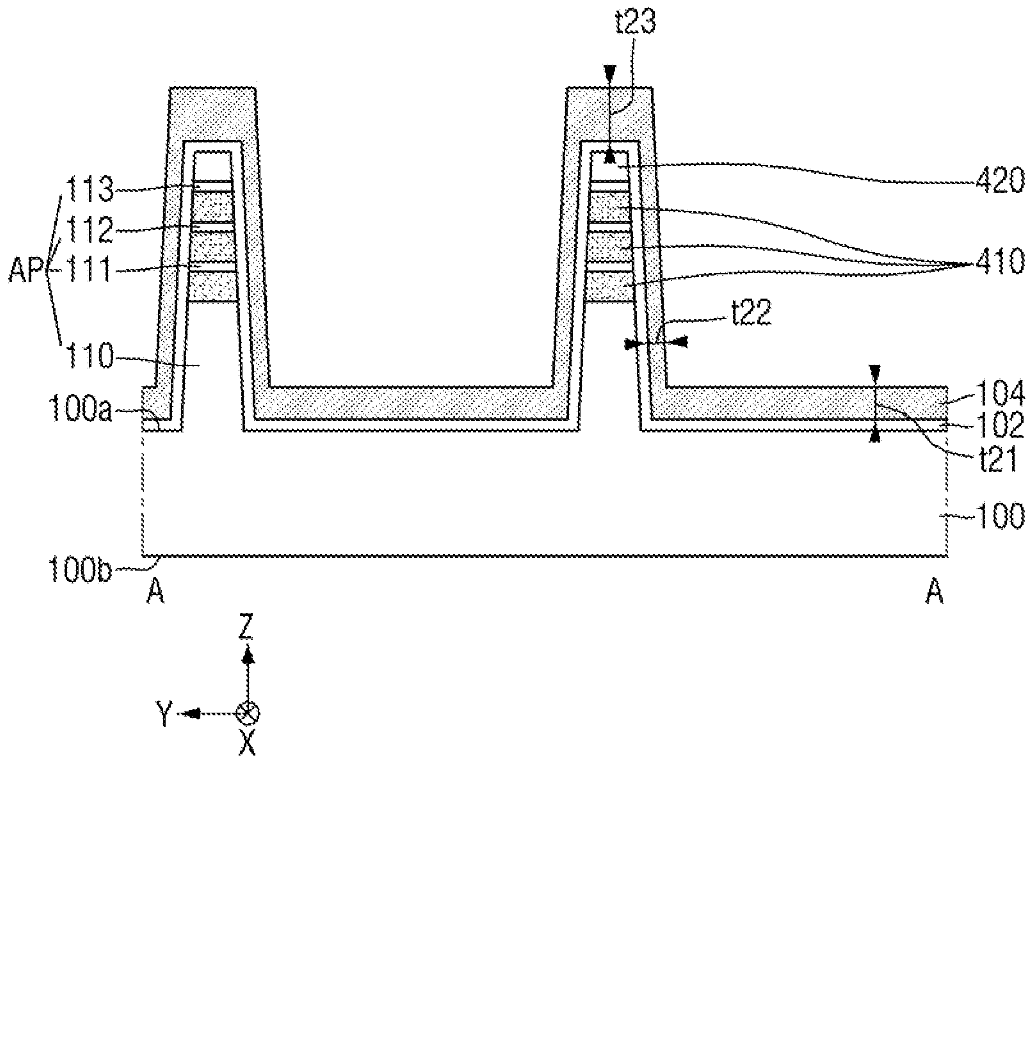

Referring to FIG. 15, the etch stop layer 104 is formed on the epitaxial liner film 102.

The etch stop layer 104 may extend along the upper side and side faces of the epitaxial liner film 102. The etch stop layer 104 may have a low step coverage. For example, the thickness t21 and the thickness t23 of a portion of the etch stop layer 104 extending along the upper side of the epitaxial liner film 102 may be greater than a thickness t22 of a portion of the etch stop layer 104 extending along the side faces of the epitaxial liner film 102. Such an etch stop layer 104 may be formed, for example, by an anisotropic deposition process. The anisotropic deposition processes may include, for example, but is not limited to, a high density plasma chemical vapor deposition (HDPCVD) process, a plasma enhanced chemical vapor deposition (PECVD) process or a physical vapor deposition process. According to one or more embodiments, the etch stop layer 104 may be formed by the high density plasma chemical vapor deposition (HDPCVD) process.

In one or more embodiments, the thickness t23 of the portion of the etch stop layer 104 on the upper side of the active pattern AP may be greater than the thickness t21 of the portion of the etch stop layer 104 on the first side 100*a* of the first substrate 100.

The etch stop layer 104 may have etch selectivity different from etch selectivity of the field insulating film 105, the first interlayer insulating film 170, and the second interlayer insulating film 210, which will be described below. As an example, when the field insulating film 105, the first interlayer insulating film 170, and the second interlayer insulating film 210 each include a silicon oxide layer (SiO layer), the etch stop layer 104 may include at least one from among a silicon nitride layer (SiN layer), a silicon carbonitride layer (SiCN layer), a silicon boron carbonitride layer (SiBCN layer), a silicon oxycarbide layer (SiOC layer), and an aluminum oxide layer (AlO layer).

Figure 16:
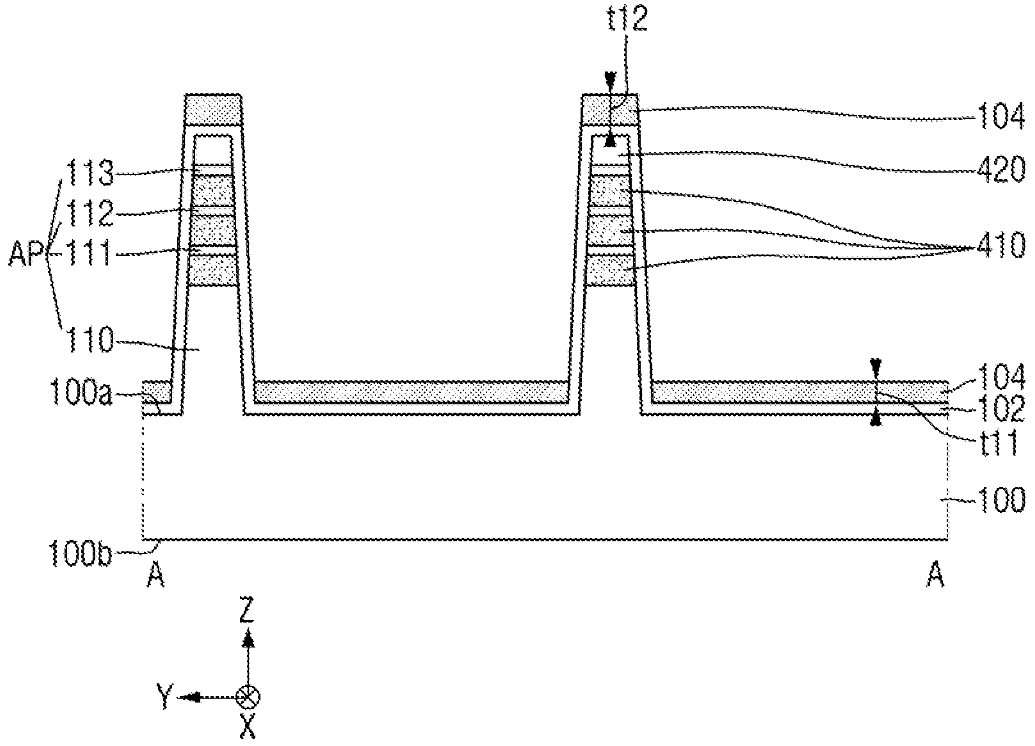

Referring to FIGS. 15 and 16, a portion of the etch stop layer 104 extending along the side faces of the epitaxial liner film 102 is removed.

For example, the recess process on the etch stop layer 104 may be performed. The recess process may include, but is not limited to, a wet etching process. As the recess process is performed, a portion of the etch stop layer 104 formed to be relatively thick on the upper side of the epitaxial liner film 102 may remain, and a portion of the etch stop layer 104 formed to be relatively thin on the side face of the epitaxial liner film 102 may be removed.

In one or more embodiments, the thickness t12 of the portion of etch stop layer 104 on the upper side of the active pattern AP may be greater than the thickness t11 of the portion of the etch stop layer 104 on the first side 100*a* of the first substrate 100 after the recess process is performed.

Figure 17:
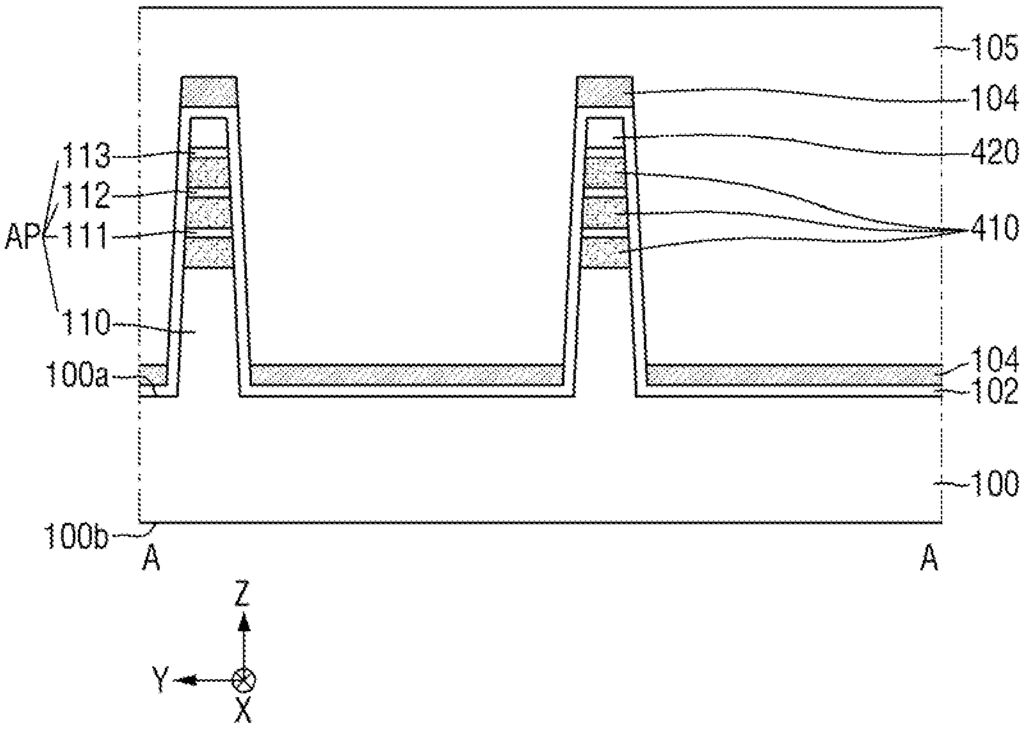

Referring to FIG. 17, the field insulating film 105 is formed on the epitaxial liner film 102 and the etch stop layer 104.

The field insulating film 105 may cover the epitaxial liner film 102 and the etch stop layer 104. The field insulating film 105 may include, for example, but is not limited to, at least one from among silicon oxide ($SiO_2$), silicon oxynitride (SiON), silicon oxycarbonitride (SiOCN), and combinations thereof. The field insulating film 105 may have an etch selectivity with respect to the etch stop layer 104. For example, if the etch stop layer 104 includes a silicon nitride layer (SiN layer), the field insulating film 105 may include a silicon oxide layer (SiO layer).

Figure 18:
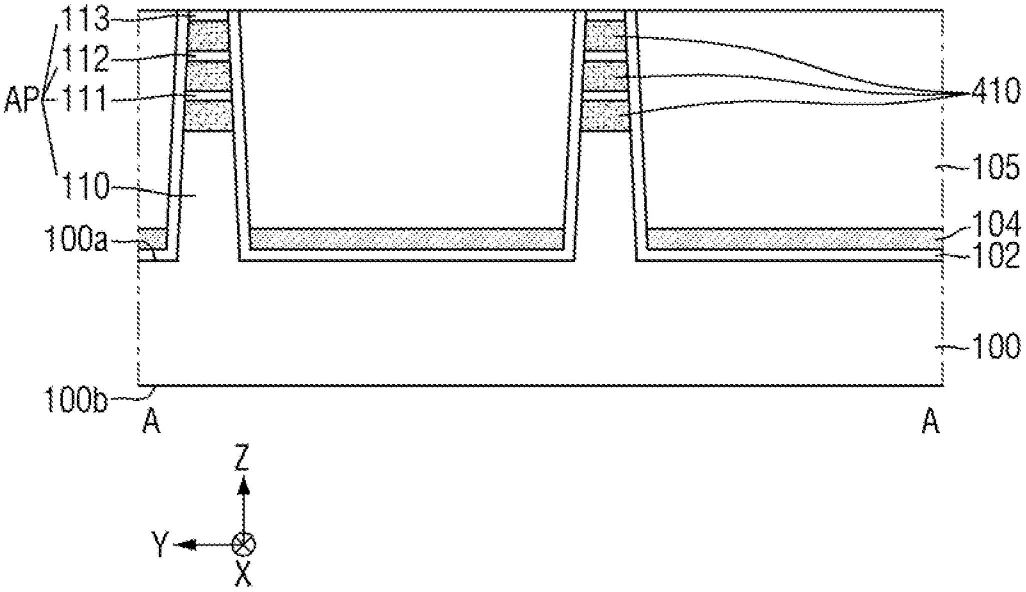

Referring to FIG. 18, a planarization process is performed.

The planarization process may include, for example, but is not limited to, a chemical mechanical polishing (CMP) process. As the planarization process is performed, the portion of the etch stop layer 104 on the upper side of the active pattern AP may be removed.

In one or more embodiments, the mask pattern 420 may be removed by the planarization process. Accordingly, the upper side of the active pattern AP or the upper side of the sacrificial pattern 410 may be exposed.

Figure 19:
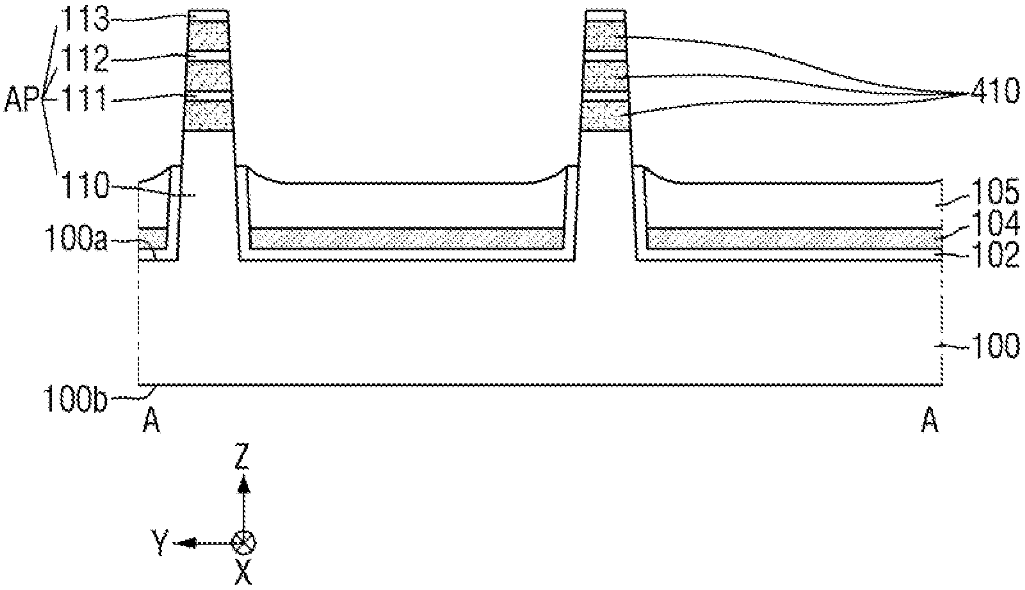

Referring to FIG. 19, a recess process on the field insulating film 105 is performed.

As the recess process is performed, the field insulating film 105 may expose at least a part of the active pattern AP and the sacrificial pattern 410. For example, the field insulating film 105 may cover a part of the side faces of the fin pattern 110.

In one or more embodiments, a part of the epitaxial liner film 102 may be removed along with a part of the field insulating film 105 by the recess process. For example, the epitaxial liner film 102 may conformally extend along the first side 100*a* and a part of the side faces of the fin pattern 110. Such an epitaxial liner film 102 may expose at least a part of the active pattern AP and the sacrificial pattern 410.

Figure 20:
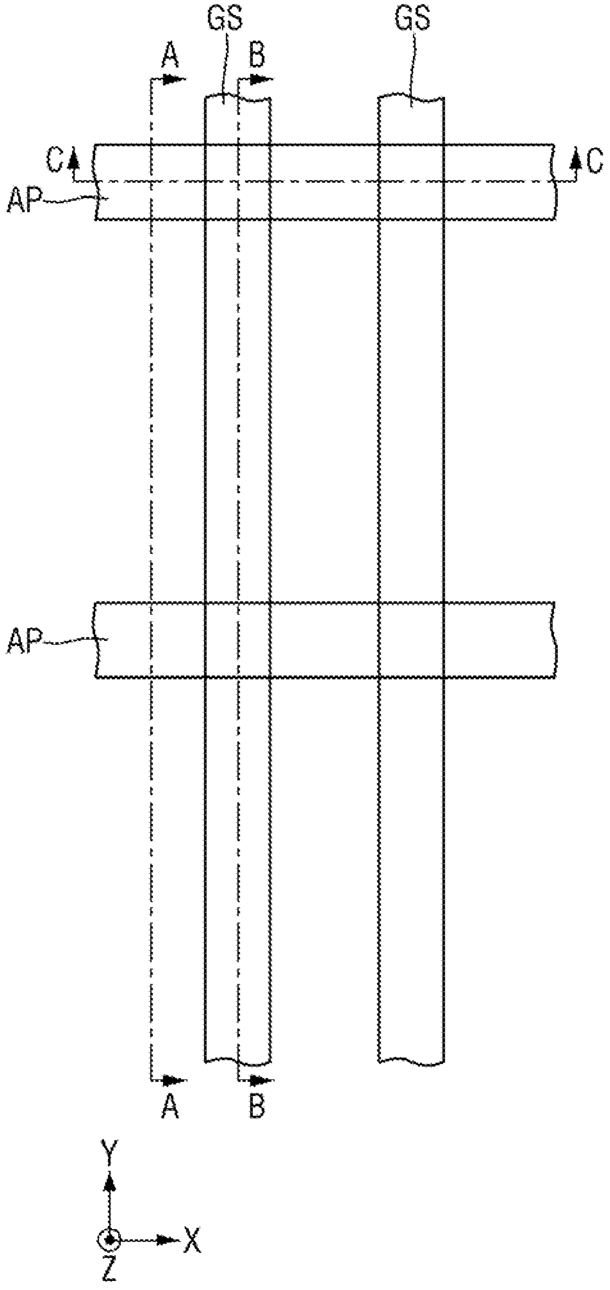
Figure 21:
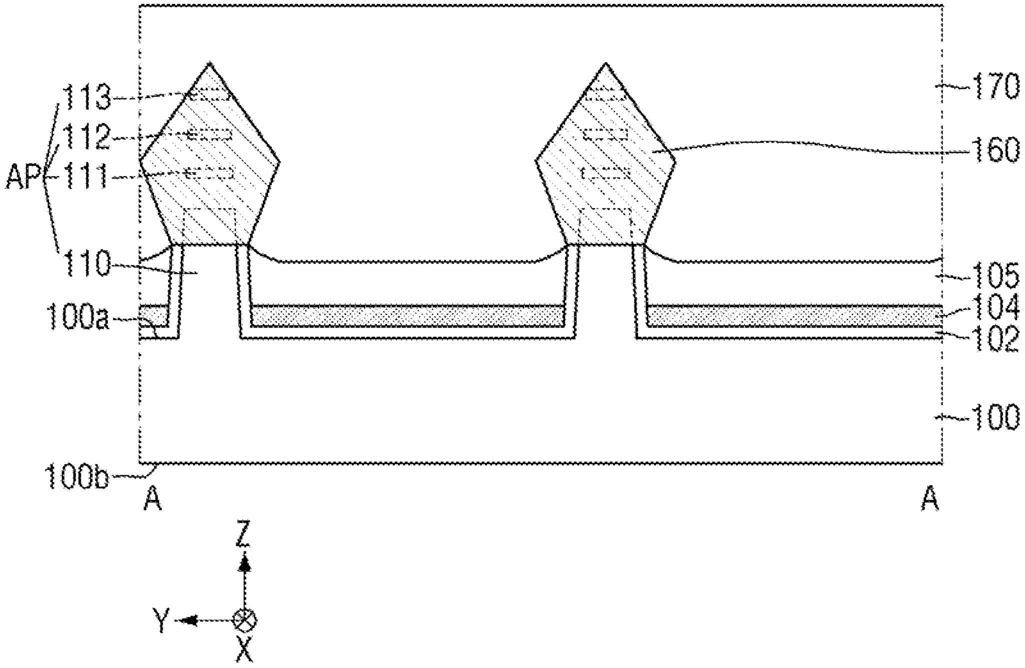
Figure 22:
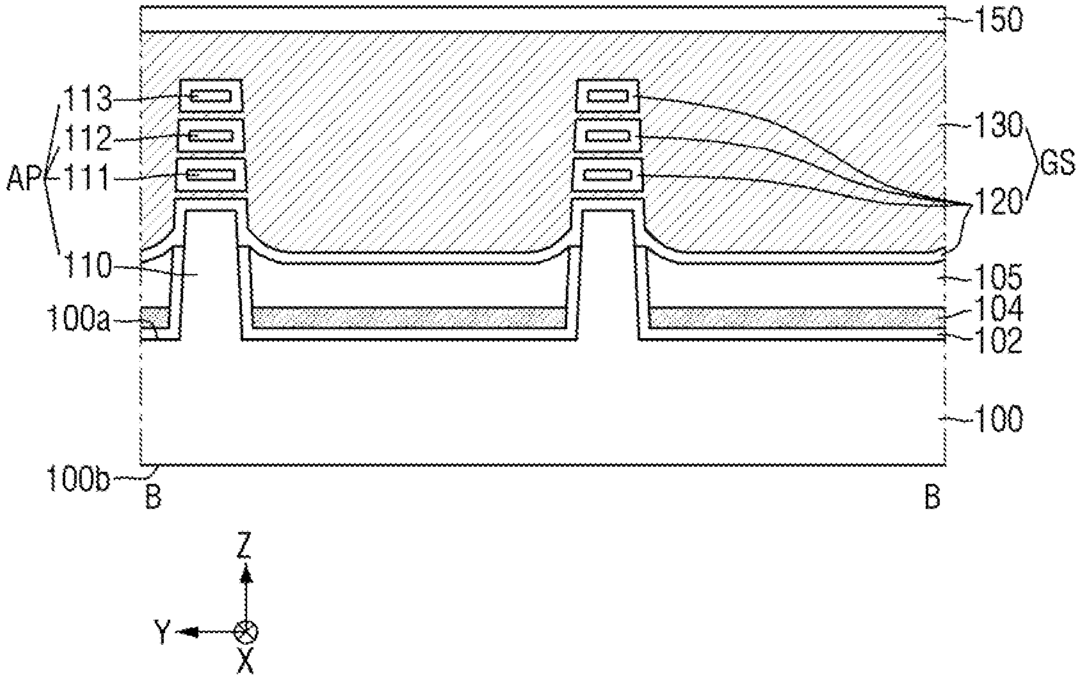
Figure 23:
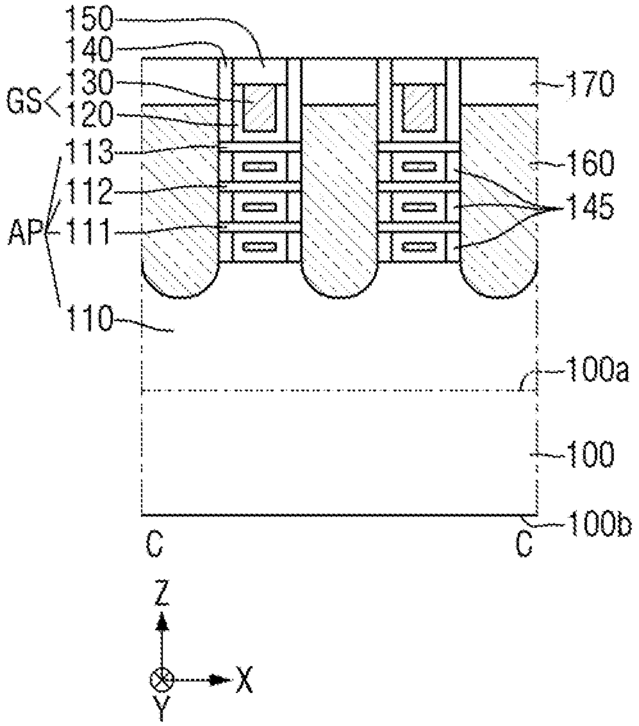

Referring to FIGS. 20 to 23, the gate structure GS, the gate spacer 140, the gate capping pattern 150, the source/drain region 160, and the first interlayer insulating film 170 are formed. For reference, FIG. 21 is a schematic cross-sectional view taken along A-A of FIG. 20, FIG. 22 is a schematic cross-sectional view taken along B-B of FIG. 20, and FIG. 23 is a schematic cross-sectional view taken along C-C of FIG. 20.

The gate structure GS may be formed on the active pattern AP and the field insulating film 105. The gate structure GS may intersect the active pattern AP. For example, a dummy gate extending long in the second direction Y may be formed on the active pattern AP. Subsequently, the gate spacer 140, the source/drain region 160, and the first interlayer insulating film 170 may be formed on the side faces of the dummy gate. The gate structure GS that replaces the dummy gate and the sacrificial patterns 410 may then be formed. The gate capping pattern 150 may extend along the upper side of the gate structure GS. Therefore, the gate structure GS surrounding each of the first bridge pattern 111, the second bridge pattern 112, and the third bridge pattern 113 may be formed. The gate structure GS may include a gate dielectric film 120 and a gate electrode 130.

The source/drain region 160 may be formed on at least one side face (e.g., both side faces) of the gate structure GS. Further, the source/drain region 160 may be connected to the active pattern AP. In one or more embodiments, the source/drain region 160 may be an epitaxial pattern formed by an epitaxial growth process that uses the active pattern AP as a seed layer.

The first interlayer insulating film 170 may be formed to fill the space on the outer side face of the gate spacer 140. For example, the first interlayer insulating film 170 may cover the field insulating film 105 and the source/drain region 160.

Figure 24:
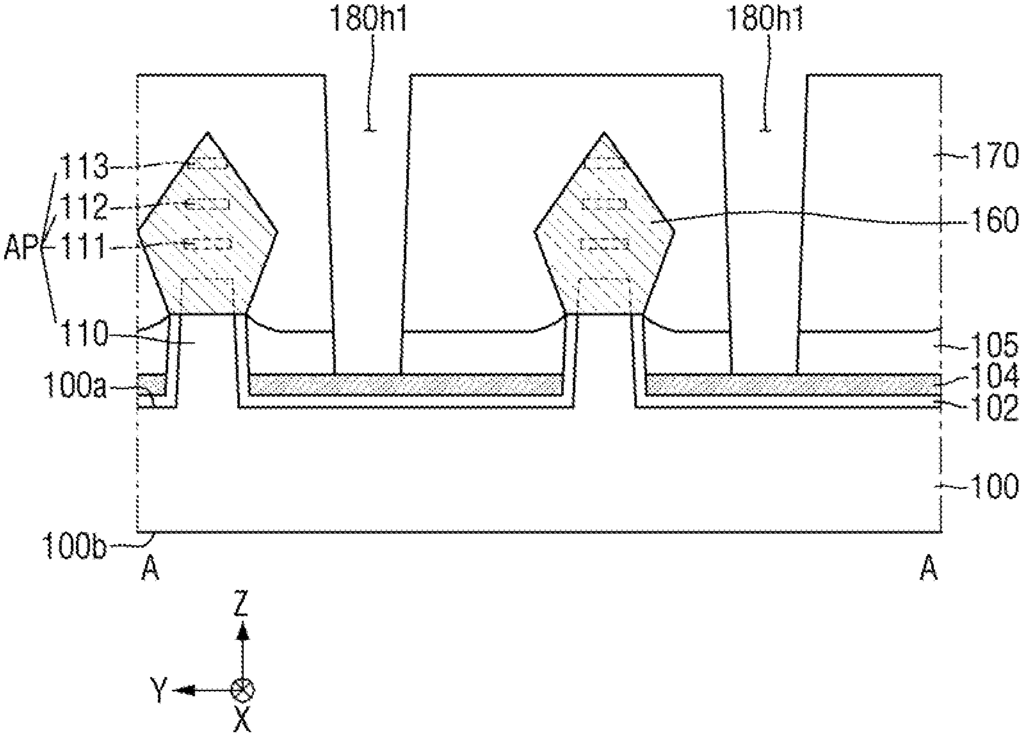

Referring to FIG. 24, a first contact hole 180*h*1 is formed.

The first contact hole 180*h*1 may penetrate the first interlayer insulating film 170 and the field insulating film 105. The first contact hole 180*h*1 may be formed by an etching process that uses the etch stop layer 104 as an etch stop layer. That is, the first contact hole 180*h*1 may expose the upper side of the etch stop layer 104.

Figure 25:
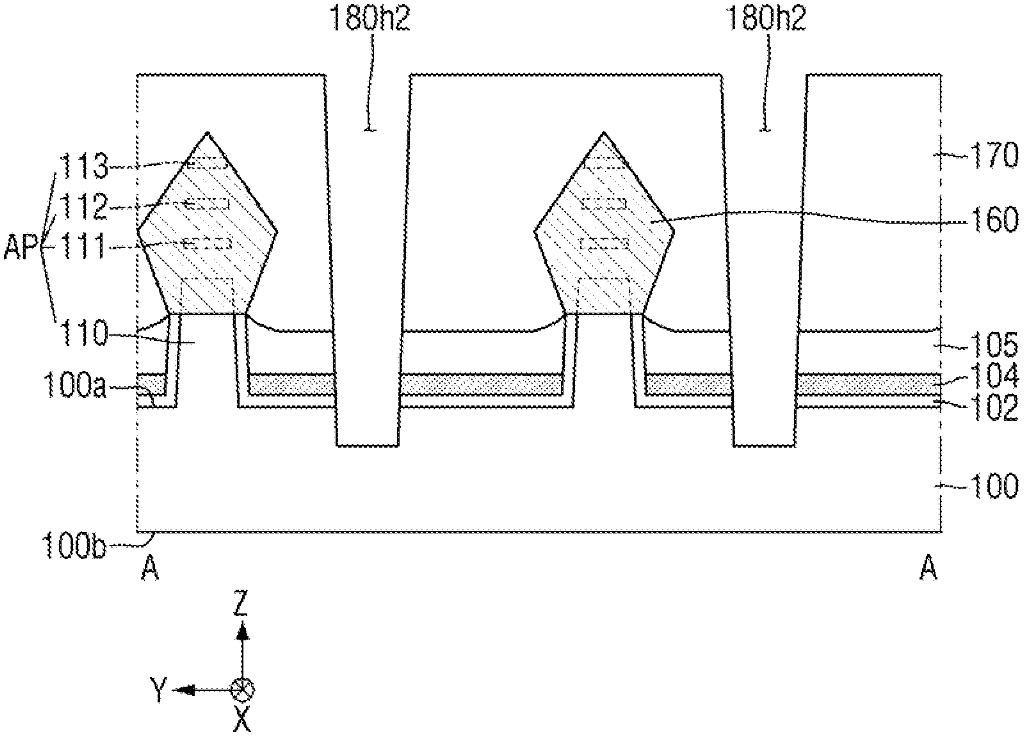

Referring to FIG. 25, a second contact hole 180*h*2 is formed using the first contact hole 180*h*1.

The second contact hole 180*h*2 may expose the first substrate 100. For example, an etching process of exposing the first substrate 100 using the first contact hole 180*h*1 may be performed. As a result, the second contact hole 180*h*2 which sequentially penetrates the first interlayer insulating film 170, the field insulating film 105, the etch stop layer 104, and the epitaxial liner film 102 may be formed. A lower side of the second contact hole 180*h*2 may be formed to be lower than the first side 100*a* of the first substrate 100.

Figure 26:
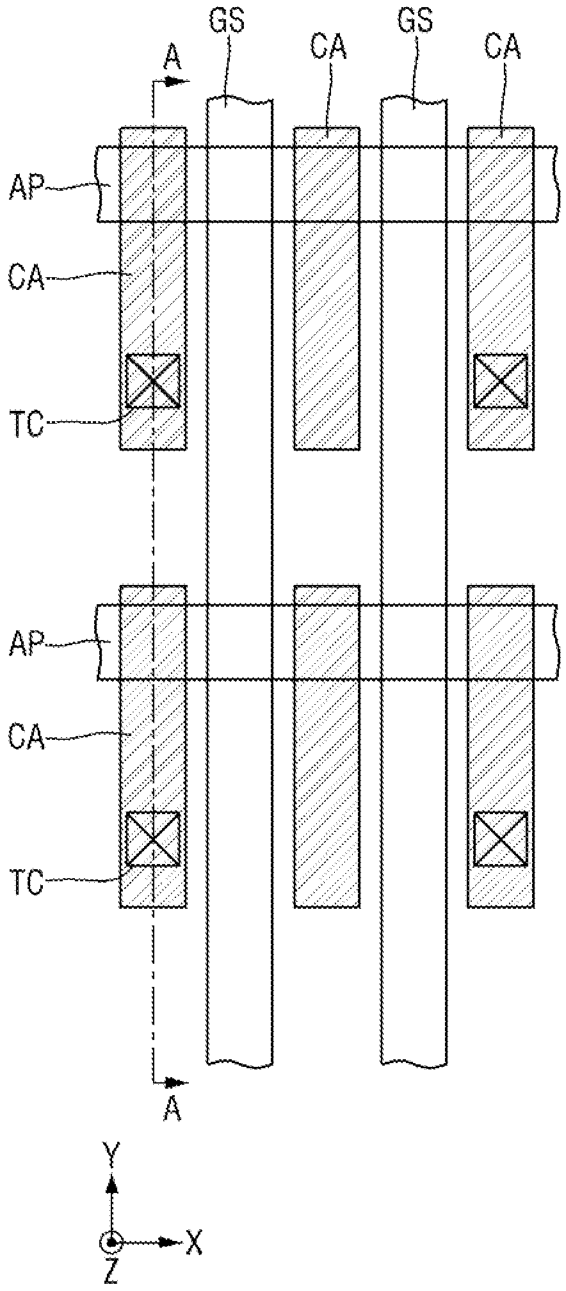
Figure 27:
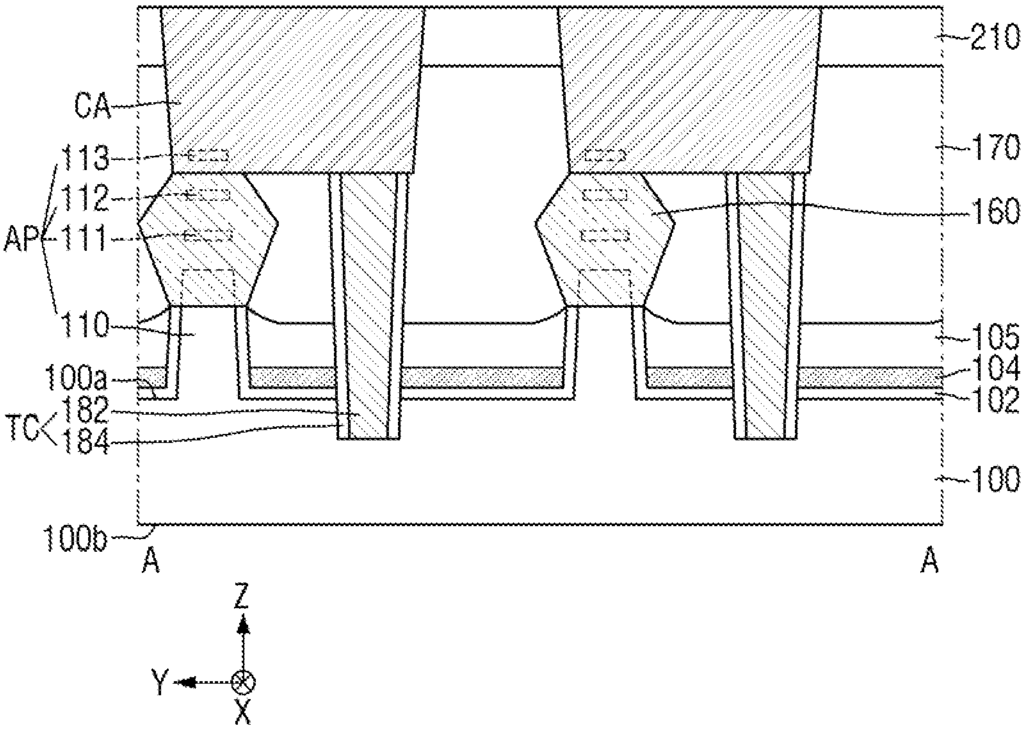

Referring to FIGS. 26 to 27, the through contact TC and the source/drain contact CA are formed. For reference, FIG. 27 is a schematic cross-sectional view taken along A-A of FIG. 26.

The through contact TC may fill the second contact hole 180*h*2. Therefore, the through contact TC connected to the first substrate 100 may be formed. In one or more embodiments, the through contact TC may include a through conductive film 182 and a through spacer 184.

The source/drain contact CA may be connected to the source/drain region 160. For example, a second interlayer insulating film 210 may be formed on the first interlayer insulating film 170. Subsequently, the source/drain contact CA which penetrates the first interlayer insulating film 170 and the second interlayer insulating film 210 and is connected to the source/drain region 160 may be formed.

In one or more embodiments, the source/drain contact CA may connect the source/drain region 160 and the through contact TC. For example, the source/drain contact CA may be connected to the upper part of the through contact TC.

Figure 28:
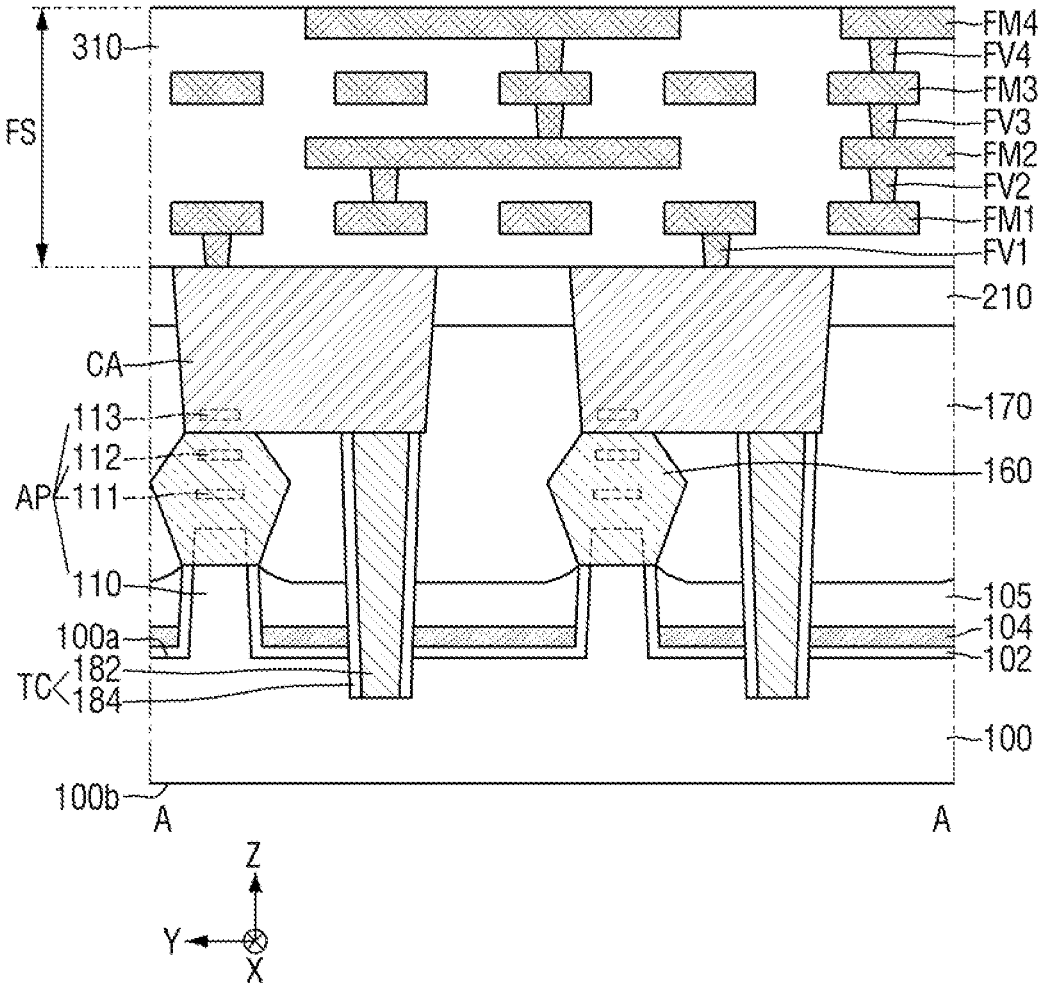

Referring to FIG. 28, a frontside wiring structure FS is formed on the second interlayer insulating film 210.

For example, a frontside inter-wiring insulating film 310, a plurality of frontside wiring patterns FM1, FM2, FM3, and FM4, and a plurality of frontside via patterns FV1, FV2, FV3, and FV4 may be formed on the second interlayer insulating film 210. The frontside wiring structure FS may provide the signal line and/or power supply line for various electronic elements (e.g., the field effect transistor including the active pattern AP and the gate structure GS) formed on the first side 100*a* of the first substrate 100. For example, the first frontside via pattern FV1 of the frontside wiring structure FS may be connected to the source/drain contact CA.

Figure 29:
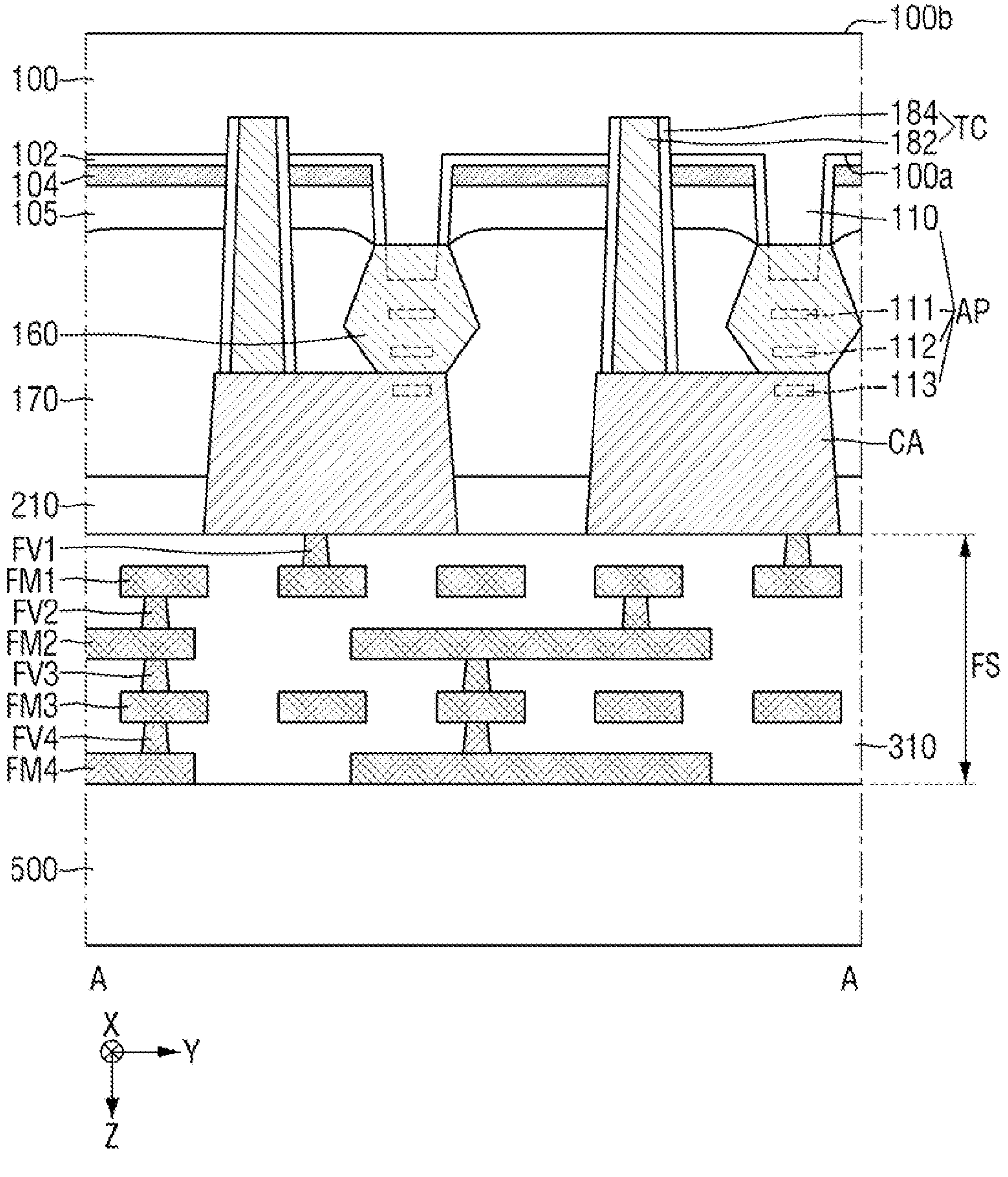

Referring to FIG. 29, the frontside wiring structure FS is attached onto the carrier substrate 500.

For example, the carrier substrate 500 may be attached onto the resulting product of FIG. 28. After the carrier substrate 500 is attached, the resulting product of FIG. 28 may be reversed. For example, the second side 100*b* of the first substrate 100 may face upward. In one or more embodiments, the frontside wiring structure FS may be attached onto the carrier substrate 500 by an oxide-oxide bonding process.

Figure 30:
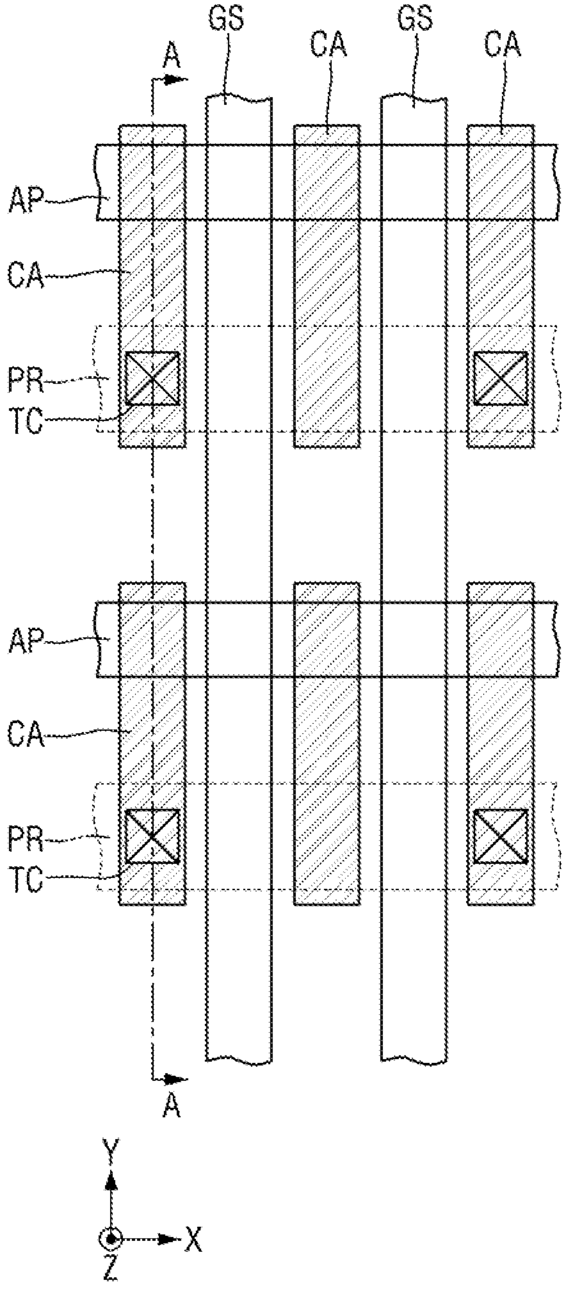
Figure 31:
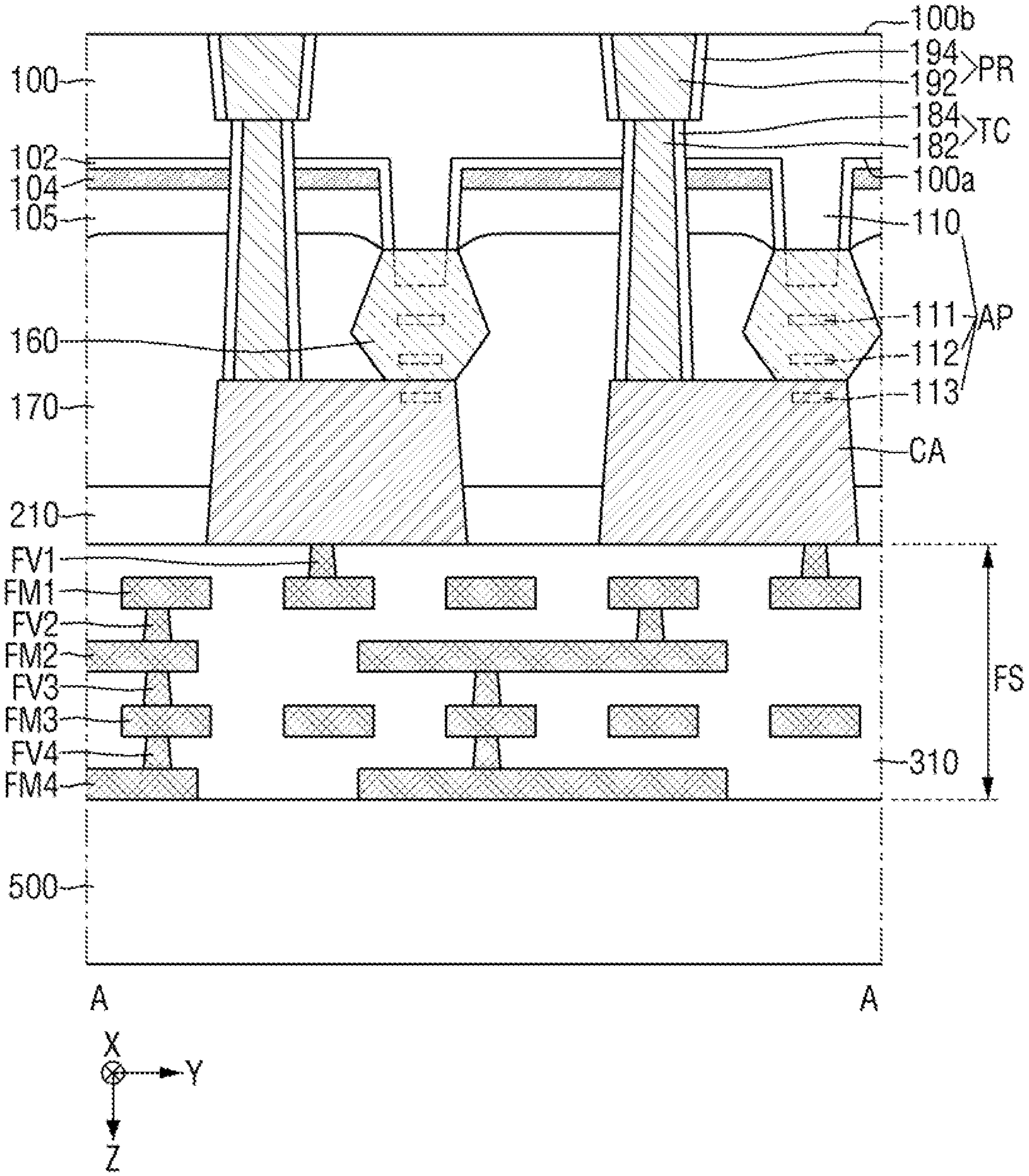

Referring to FIGS. 30 and 31, a buried pattern PR is formed. For reference, FIG. 31 is a schematic cross-sectional view taken along A-A of FIG. 30.

The buried pattern PR may be connected to the through contact TC. For example, an etching process may be performed on the second side 100*b* of the first substrate 100 to form a trench that exposes the through contact TC. After that, the buried pattern PR that fills the trench may be formed. Accordingly, the buried pattern PR may be electrically connected to various electronic elements (e.g., the field effect transistor including the active patterns AP and the gate structure GS) formed on the first side 100*a* of the first substrate 100. In one or more embodiments, the buried pattern PR may include a buried conductive film 192 and a buried spacer 194.

Next, referring to FIG. 2, a backside wiring structure BS may be formed on the second side 100*b* of the first substrate 100. For example, the backside inter-wiring insulating film 320, the plurality of backside wiring patterns BM1, BM2, and BM3, and the plurality of backside via patterns BV1, BV2, and BV3 may be formed on the second side 100*b* of the first substrate 100. After the backside wiring structure BS is formed, the carrier substrate 500 may be removed. Therefore, the semiconductor device explained above with reference to FIGS. 1 to 4 may be fabricated.

As the semiconductor devices are gradually highly integrated, the widths of wiring patterns and via patterns that implement the semiconductor devices gradually decrease. Therefore, a voltage drop (for example, IR drop) of the power delivery network (PDN) that supplies the power supply voltage to the electronic elements has become an important issue.

A semiconductor device according to one or more embodiments may have a reduced voltage drop by providing a so-called backside power delivery network (BSPDN). For example, as described above, the backside wiring structure BS that provides the power delivery network (PDN) may be disposed on the back side (e.g., the second side 100*b*) of the first substrate 100 on which the electronic elements (e.g., the field effect transistor including the active pattern AP and the gate structure GS) are not disposed. Thus, compared to a case where the power delivery network (PDN) is mounted on the front side (e.g., the first side 100*a*) of the first substrate 100, the semiconductor device according to one or more embodiments may improve a voltage drop and reduce a size, by minimizing confusion of routing.

On the other hand, for a connection between the backside power delivery network (BSPDN) and the electronic element, the through contact TC and the buried pattern PR connected to the through contact TC may be used. However, due to the high aspect ratio of the through contact TC, a variation may occur in the depth at which the through contact TC is formed in the first substrate 100. As an example, the through contact TC of a relatively large size (or width) may be formed to be deeper than the through contact TC of a relatively small size (or width), due to an etching rate difference in the etching process for forming the through contact TC. This causes problems such as a poor contact with the buried pattern PR formed in the subsequent process or variation in contact resistance with the buried pattern PR.

In order to solve such a problem, an etch stop layer may be used in the etching process for forming the through contact TC. However, the etch stop layer that is simply formed on the front side of the substrate (e.g., the first side 100*a* of the first substrate 100) extends along the side faces of the active pattern AP to cause a leakage current. As an example, an etch stop layer extending along the side faces of the fin pattern 110 may provide a leakage path at the interface with the fin pattern 110.

In contrast, in the semiconductor device according to one or more embodiments, the etch stop layer 104 extends along the first side 100*a* of the first substrate 100, and may not extend along the side faces of the active patterns AP. The etch stop layer 104 improves the variation of the depths of the through contacts TC formed in the first substrate 100 and may reduce the leakage current of the active pattern AP, in the etching process for forming the through contact TC. Accordingly, performance and reliability are improved in a semiconductor device including a backside power delivery network (BSPDN), and a semiconductor device having improved PPAC can be provided.

Figure 32:
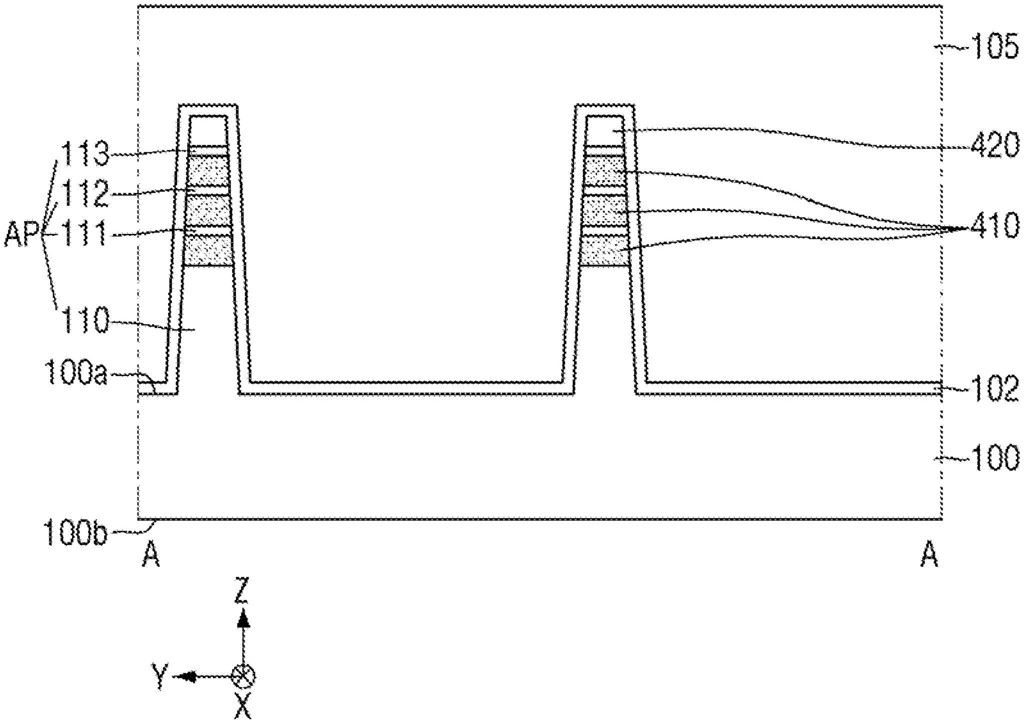
FIGS. 32 to 36 are intermediate step diagrams for explaining a method for fabricating a semiconductor device according to one or more embodiments.

FIGS. 32 to 36 are intermediate step diagrams for explaining a method for fabricating the semiconductor device according to one or more embodiments. For convenience of explanation, repeated parts of the contents explained above with reference to FIGS. 1 to 31 will be briefly explained or omitted. For reference, FIG. 32 is an intermediate step diagram for explaining a step after the step illustrated in FIG. 14.

Referring to FIG. 32, the field insulating film 105 is formed on the epitaxial liner film 102.

The field insulating film 105 may cover the epitaxial liner film 102. Since the formation of the field insulating film 105 is similar to that explained above with reference to FIG. 17, repeated detailed description thereof will not be provided.

Figure 33:
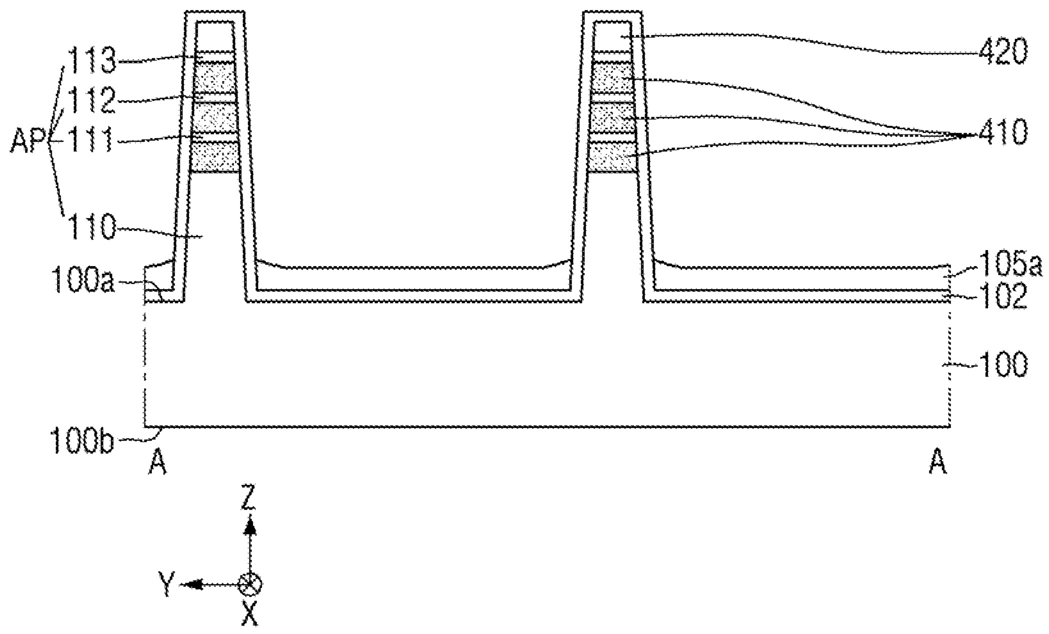

Referring to FIG. 33, a recess process is performed on the field insulating film 105.

As the recess process is performed, a first insulating film 105*a* that exposes a part of the epitaxial liner film 102 may be formed. For example, the first insulating film 105*a* may cover a part of the side faces of the fin pattern 110.

Figure 34:
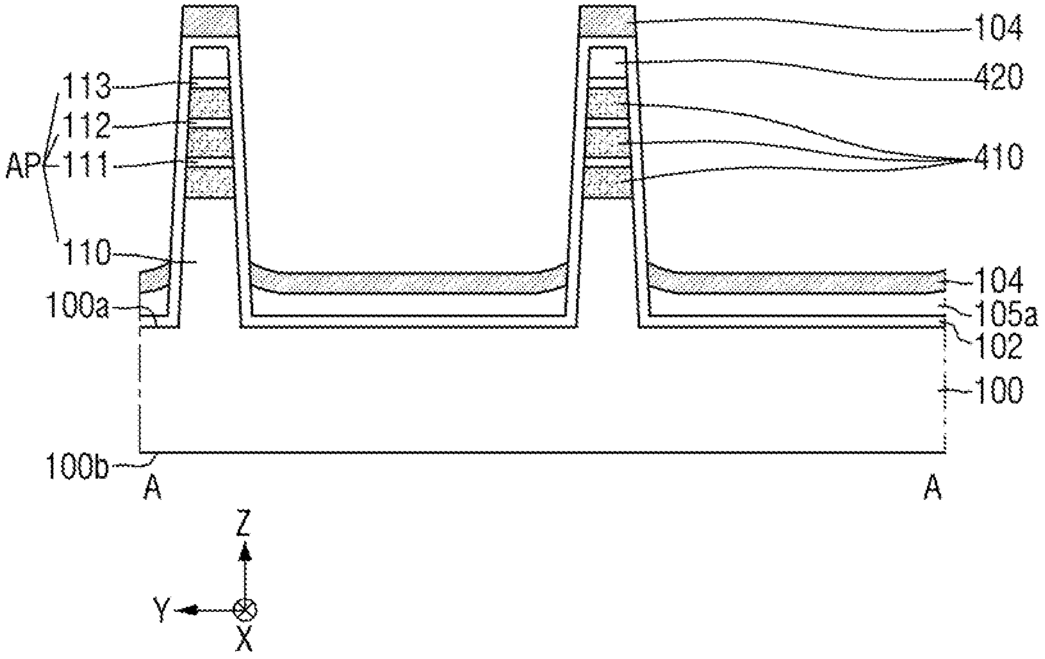

Referring to FIG. 34, the etch stop layer 104 is formed on the epitaxial liner film 102 and the first insulating film 105*a*.

The etch stop layer 104 may be formed on the upper side of the epitaxial liner film 102 and the upper side of the first insulating film 105*a*. Also, the etch stop layer 104 may not be formed on the side face of the epitaxial liner film 102. Since the formation of such an etch stop layer 104 is similar to that explained above with reference to the figures, a repeated detailed description thereof will not be provided.

Figure 35:
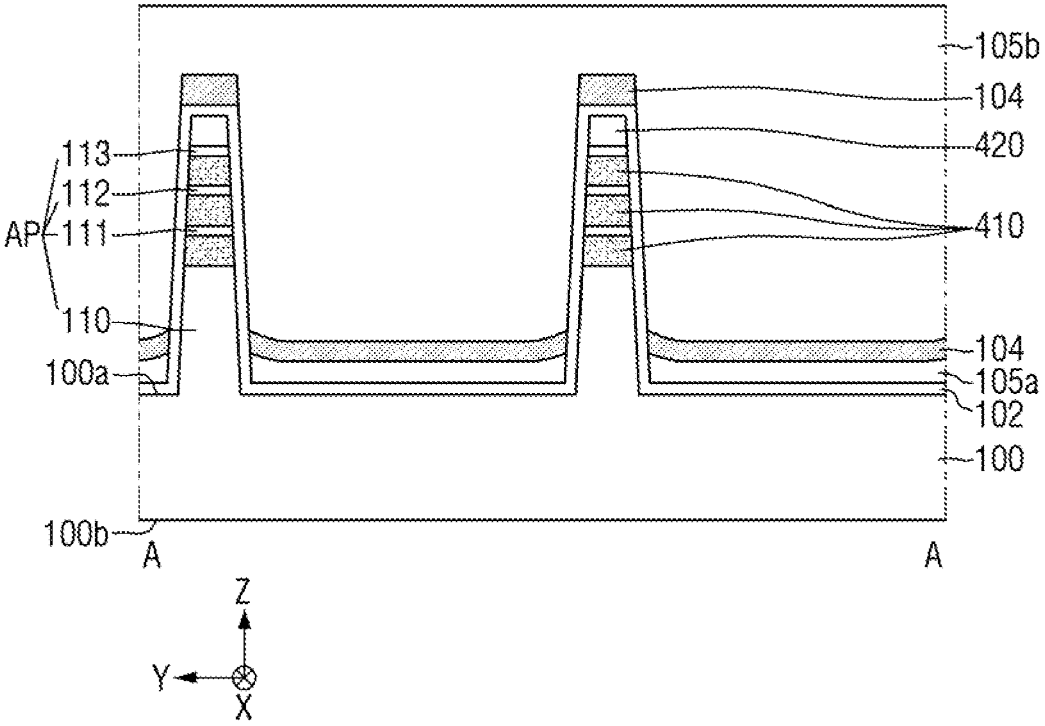

Referring to FIG. 35, the second insulating film 105*b* is formed on the epitaxial liner film 102 and the etch stop layer 104.

The second insulating film 105*b* may cover the epitaxial liner film 102 and the etch stop layer 104. Since the formation of the second insulating film 105*b* is similar to that explained above with reference to FIG. 17, repeated detailed description thereof will not be provided below.

Figure 36:
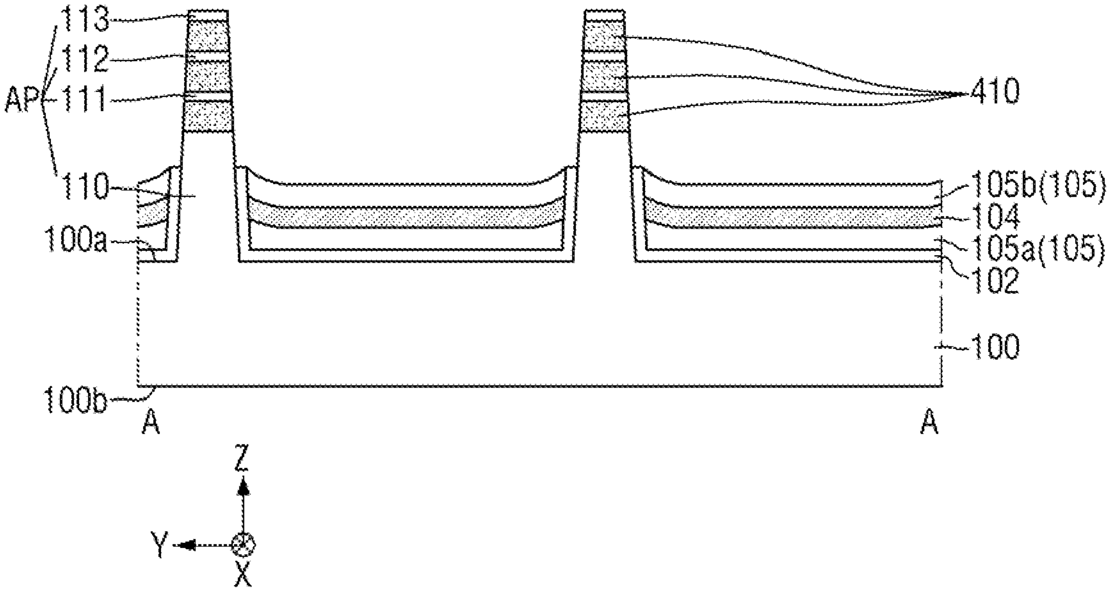

Referring to FIG. 36, a recess process is performed on the second insulating film 105*b*.

As the recess process is performed, the second insulating film 105*b* may expose at least a part of the active pattern AP and the sacrificial pattern 410. Since the recess process on the second insulating film 105*b* is similar to that explained above with reference to FIGS. 18 and 19, repeated detailed description thereof will not be provided.

The steps explained above with reference to FIGS. 20 to 31 and 2 may then be performed. Therefore, the semiconductor device explained above with reference to FIG. 5 may be fabricated.

Figure 37:
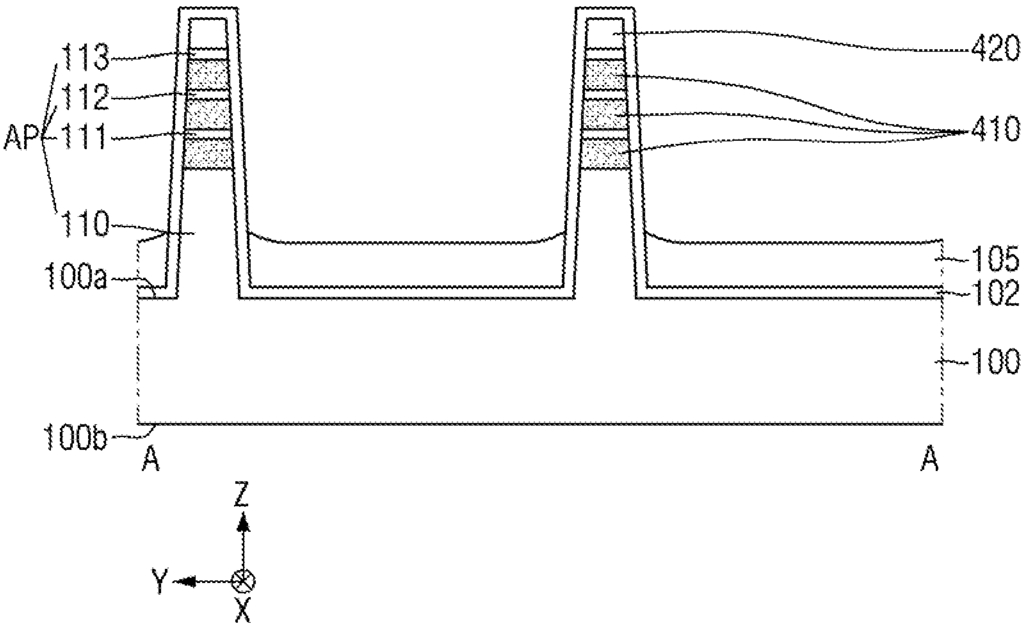
FIGS. 37 to 40 are intermediate steps diagrams for explaining a method for fabricating a semiconductor device according to one or more embodiments.

FIGS. 37 to 40 are intermediate steps diagrams for explaining the method for fabricating the semiconductor device according to one or more embodiments. For convenience of explanation, repeated parts of the contents explained above with reference to FIGS. 1 to 36 will be briefly explained or omitted. For reference, FIG. 37 is an intermediate step diagram for explaining the step after FIG. 32.

Referring to FIG. 37, a recess process is performed on the field insulating film 105.

As the recess process is performed, the field insulating film 105 may expose a part of the epitaxial liner film 102. For example, the field insulating film 105 may cover a part of the side faces of the fin pattern 110.

Figure 38:
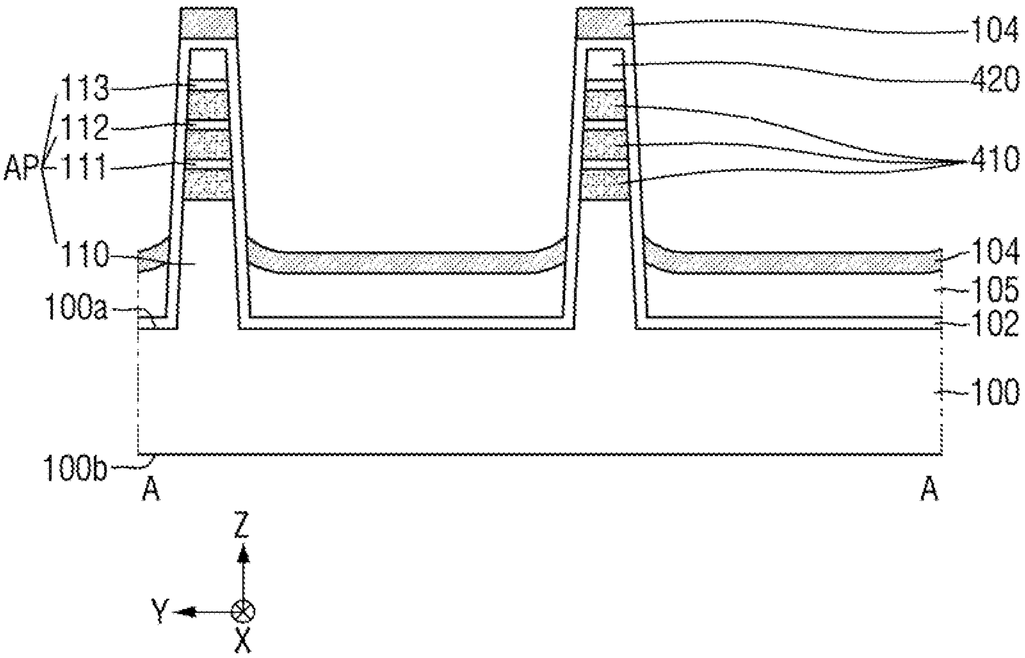

Referring to FIG. 38, an etch stop layer 104 is formed on the epitaxial liner film 102 and the field insulating film 105.

The etch stop layer 104 may be formed on the upper side of the epitaxial liner film 102 and the upper side of the field insulating film 105. Also, the etch stop layer 104 may not be formed on the side face of the epitaxial liner film 102. Since the formation of such an etch stop layer 104 is similar to that explained above with reference to FIGS. 15 and 16, repeated detailed description thereof will not be provided.

Figure 39:
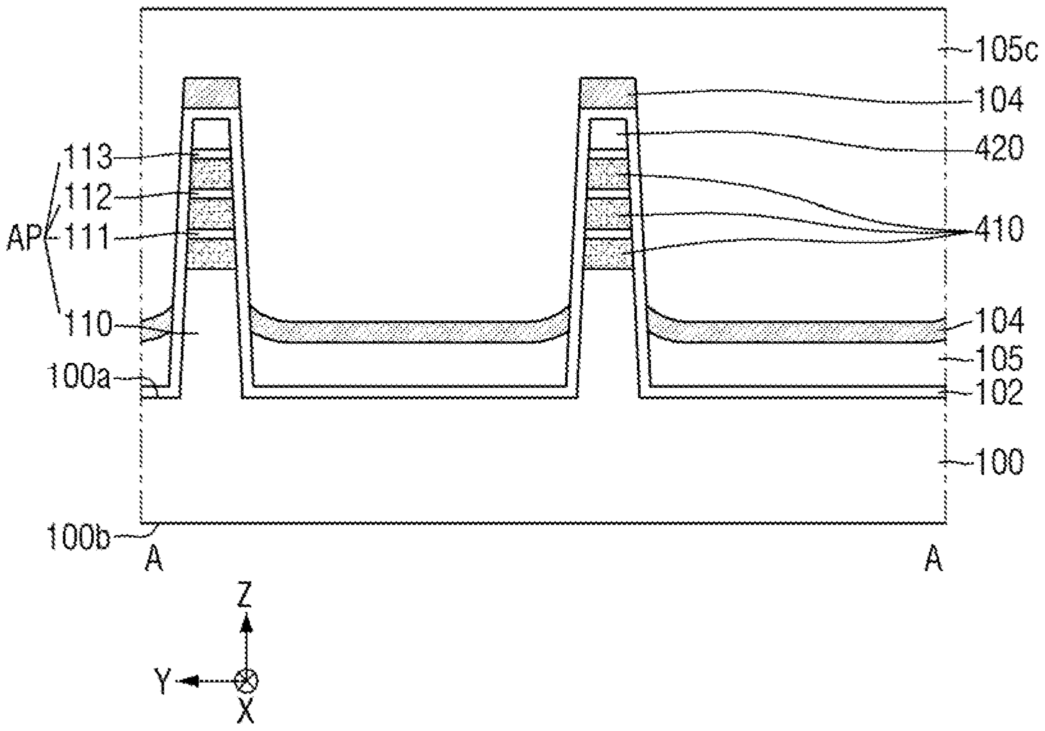

Referring to FIG. 39, a sacrificial insulating film 105*c* is formed on the epitaxial liner film 102 and the etch stop layer 104.

The sacrificial insulating film 105*c* may cover the epitaxial liner film 102 and the etch stop layer 104. Since the formation of the sacrificial insulating film 105*c* is similar to as explained above with reference to FIG. 17, repeated detailed description thereof will not be provided.

Figure 40:
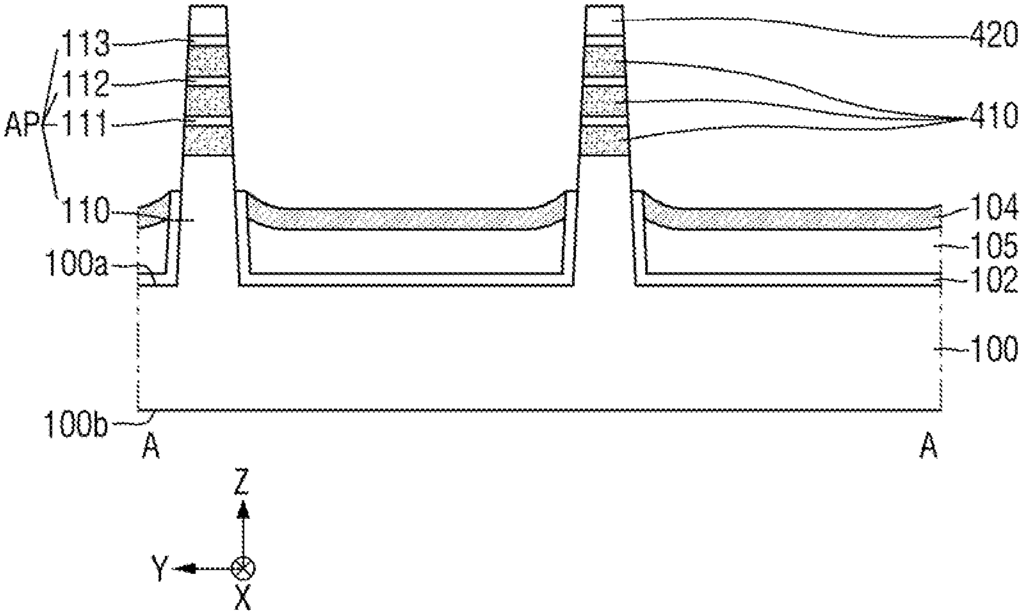

Referring to FIG. 40, at least a part of the active pattern AP and the sacrificial pattern 410 are exposed.

For example, portions of the epitaxial liner film 102 and the sacrificial insulating film 105*c* on the upper side of the etch stop layer 104 may be removed. Since exposure of at least a part of the active pattern AP and the sacrificial pattern 410 is similar to that explained above with reference to FIGS. 17 to 19, repeated detailed description thereof will not be provided.

The steps explained above with reference to FIGS. 20 to 31 and 2 may then be performed. Accordingly, the semiconductor device explained above with reference to FIG. 6 may be fabricated.

Figure 41:
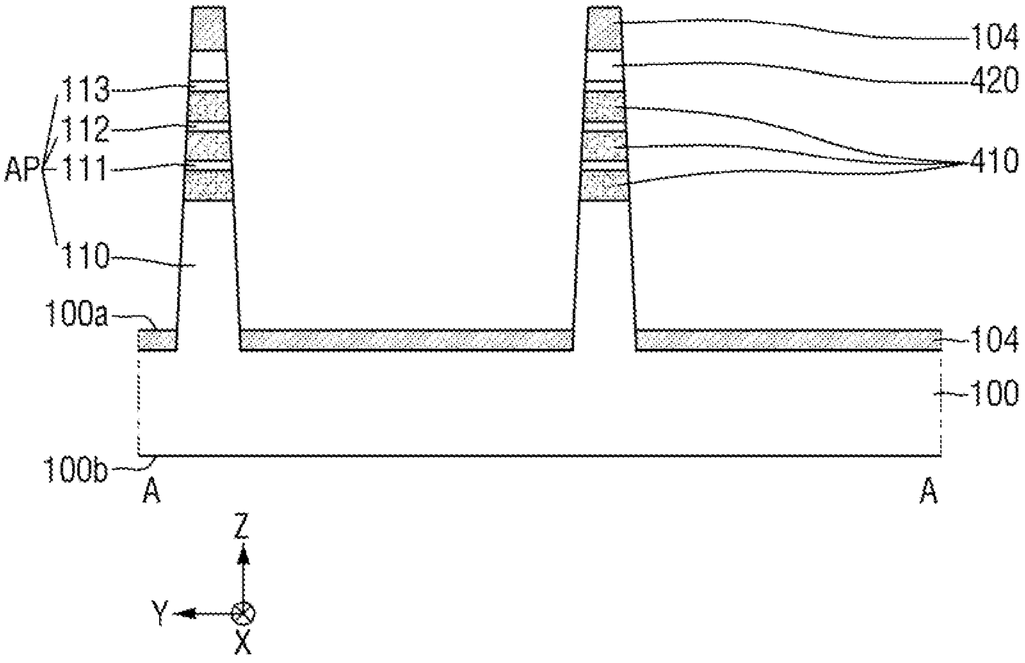
FIGS. 41 to 44 are intermediate step diagrams for explaining a method for fabricating a semiconductor device according to one or more embodiments.

FIGS. 41 to 44 are intermediate step diagrams for explaining the method for fabricating the semiconductor device according to one or more embodiments. For convenience of explanation, repeated parts of the contents explained above with reference to FIGS. 1 to 40 will be briefly explained or omitted. For reference, FIG. 41 is an intermediate step diagram for explaining the step after FIG. 13.

Referring to FIG. 41, an etch stop layer 104 is formed on the first side 100*a* of the first substrate 100.

The etch stop layer 104 may be formed on the first side 100*a* of the first substrate 100 and the upper side of the mask pattern 420. Also, the etch stop layer 104 may not be formed on the side faces of the active pattern AP and the side faces of the sacrificial pattern 410. Since the formation of such an etch stop layer 104 is similar to that explained above with reference to FIGS. 15 and 16, repeated detailed description thereof will not be provided.

Figure 42:
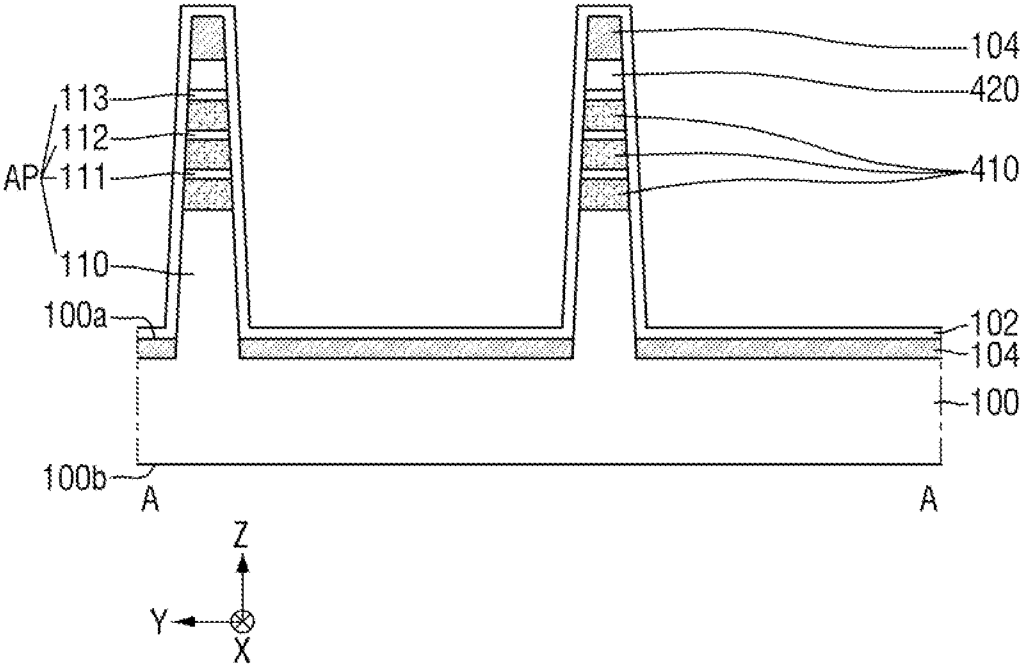

Referring to FIG. 42, the epitaxial liner film 102 is formed on the etch stop layer 104.

The epitaxial liner film 102 may conformally extend along the etch stop layer 104, the side faces of the active pattern AP, and the side faces of the sacrificial pattern 410. Formation of the epitaxial liner film 102 is similar to that explained above with reference to FIG. 14, and therefore repeated detailed description thereof will not be provided.

Figure 43:
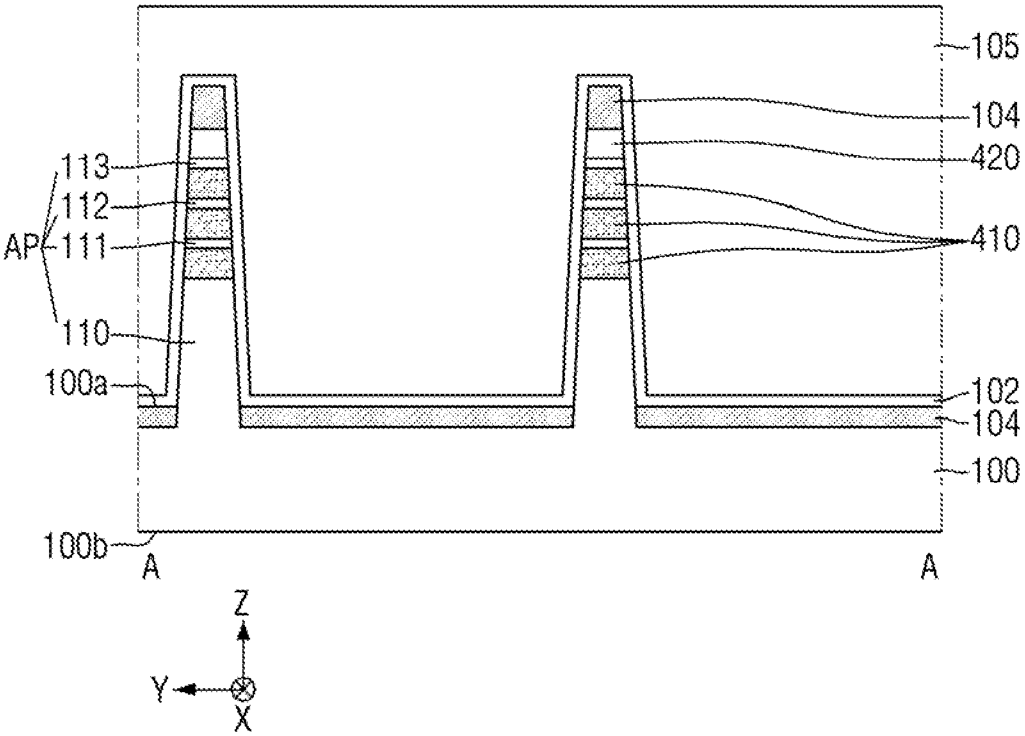

Referring to FIG. 43, the field insulating film 105 is formed on the epitaxial liner film 102.

The field insulating film 105 may cover the epitaxial liner film 102. Since the formation of the field insulating film 105 is similar to that explained above with reference to FIG. 17, repeated detailed description thereof will not be provided.

Figure 44:
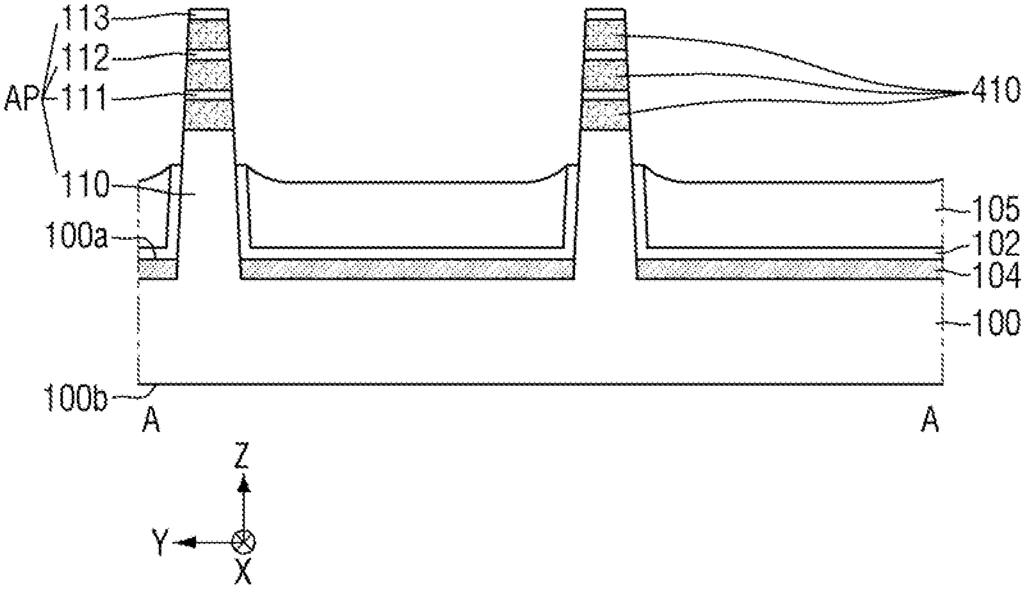

Referring to FIG. 44, a recess process is performed on the field insulating film 105.

As the recess process is performed, the field insulating film 105 may expose at least a part of the active pattern AP and the sacrificial pattern 410. For example, the field insulating film 105 may cover a part of the side faces of the fin pattern 110. Since the process of performing the recess process on the field insulating film 105 is similar to that explained above with reference to FIGS. 18 and 19, repeated detailed description thereof will not be provided.

The steps explained above with reference to FIGS. 20 to 31 and 2 may then be performed. Therefore, the semiconductor device explained above with reference to FIG. 7 may be fabricated.

Figure 45:
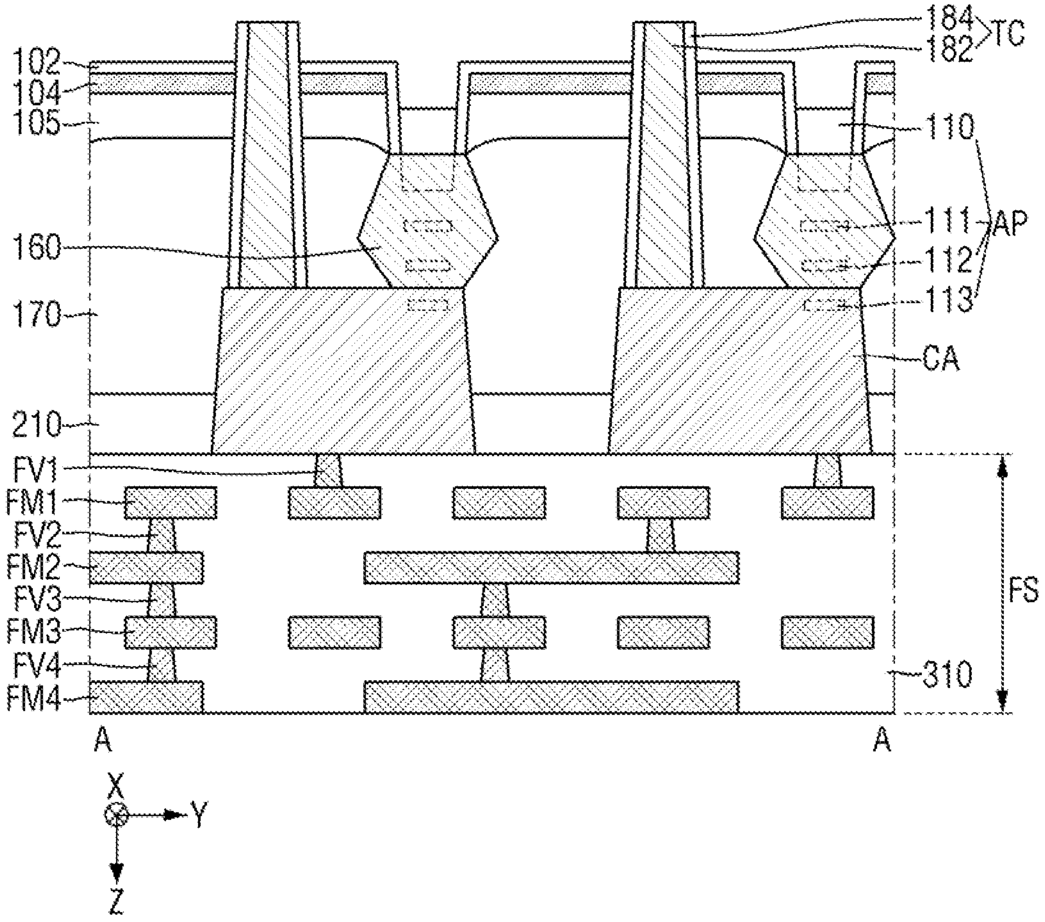
FIGS. 45 and 46 are intermediate step diagrams for describing a method for fabricating a semiconductor device according to one or more embodiments.
Figure 46:
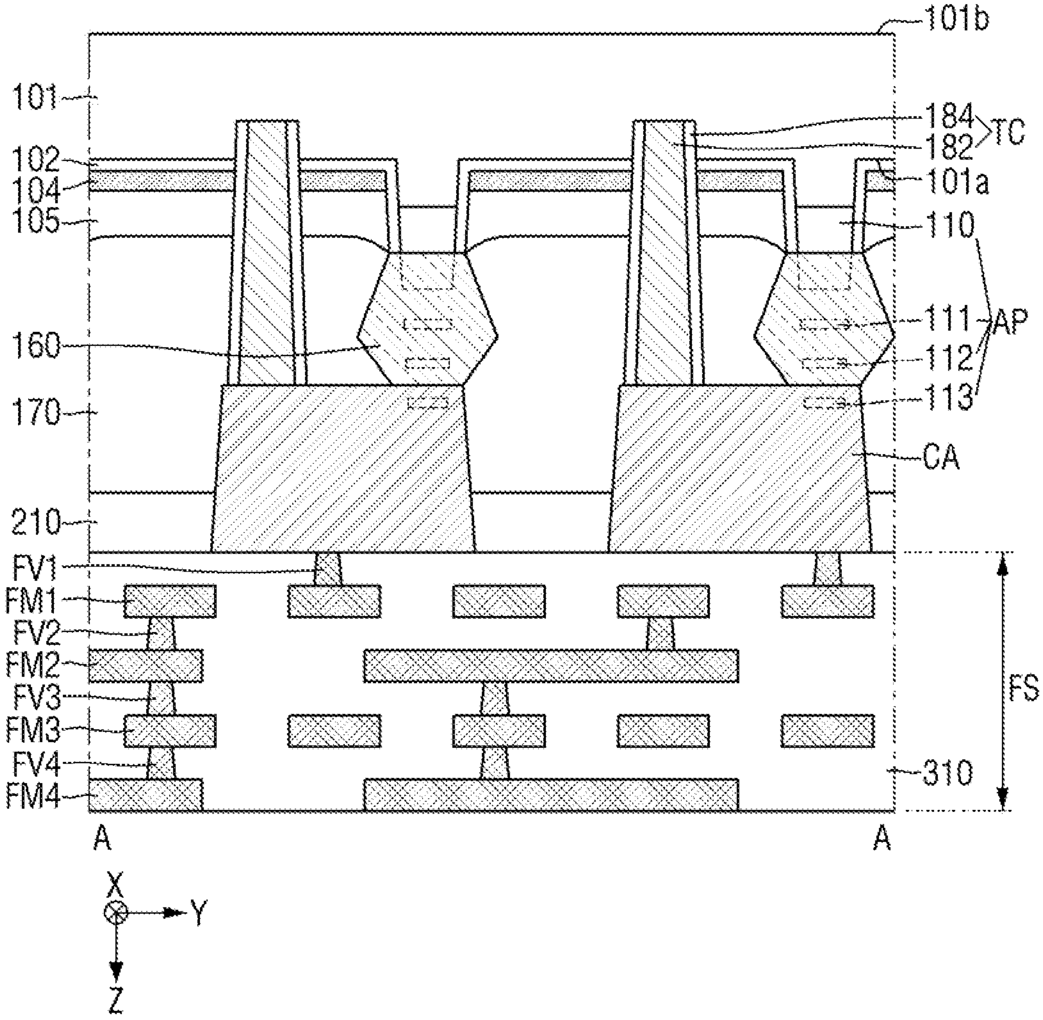

FIGS. 45 and 46 are intermediate step diagrams for describing the method for fabricating the semiconductor device according to one or more embodiments. For convenience of explanation, repeated parts of the contents explained above with reference to FIGS. 1 to 40 will be briefly explained or omitted. For reference, FIG. 45 is an intermediate step diagram for explaining the step after FIG. 29.

Referring to FIGS. 29 and 45, the first substrate 100 is removed.

For example, the second side 100*b* of the first substrate 100 may be subjected to a back grinding process. As the first substrate 100 is removed, the through contact TC may be exposed. In one or more embodiments, at least a part of the fin pattern 110 may be removed in the process of removing first substrate 100.

Referring to FIG. 46, a second substrate 101 is formed.

The second substrate 101 may be an insulating substrate. For example, the second substrate 101 may include, but is not limited to, at least one from among silicon oxide, silicon oxynitride, silicon oxycarbonitride and combinations thereof. The second substrate 101 may replace a region from which the first substrate 100 and the fin pattern 110 are removed.

The steps explained above with reference to FIGS. 30, 31 and 2 may then be performed. Therefore, the semiconductor device explained above with reference to FIG. 8 may be fabricated.

Those skilled in the art will appreciate that many variations and modifications may be made to the non-limiting example embodiments of the present disclosure without departing from the principles of the present disclosure. Therefore, the described example embodiments of the present disclosure are provided for purposes of description and not for purposes of limitation.

What is claimed is:

1. A semiconductor device comprising:
- a substrate comprising a first side and a second side opposite to the first side;
- an active pattern that is on the first side and extends in a first direction;
- an etch stop layer that extends along the first side of the substrate and does not extend along side faces of the active pattern;
- a field insulating film that is on the first side and covers at least a part of the side faces of the active pattern;
- a gate structure that extends in a second direction intersecting the first direction on the active pattern and the field insulating film;
- a through contact that extends in a third direction intersecting the first direction and the second direction and penetrates the field insulating film and the etch stop layer;
- a buried pattern connected to the through contact, inside the substrate; and
- a backside wiring structure that is on the second side and electrically connected to the buried pattern.

2. The semiconductor device of claim 1, wherein the etch stop layer is interposed between the substrate and the field insulating film.

3. The semiconductor device of claim 1, wherein the field insulating film comprises a silicon oxide layer, and
- wherein the etch stop layer comprises at least one from among a silicon nitride layer, a silicon carbonitride layer, a silicon boron carbonitride layer, a silicon oxycarbide layer, and an aluminum oxide layer.

4. The semiconductor device of claim 1, wherein the etch stop layer has a thickness of 1 nm to 100 nm.

5. The semiconductor device of claim 1, further comprising:

an epitaxial liner film extending along the first side of the substrate and the side faces of the active pattern.

6. The semiconductor device of claim 5, wherein the epitaxial liner film is between the substrate and the etch stop layer.

7. The semiconductor device of claim 5, wherein the etch stop layer is between the substrate and the epitaxial liner film.

8. The semiconductor device of claim 5, wherein the epitaxial liner film comprises a silicon layer.

9. The semiconductor device of claim 1, wherein at least a part of the field insulating film is between the substrate and the etch stop layer.

10. The semiconductor device of claim 9, wherein the field insulating film comprises a first insulating film and a second insulating film sequentially stacked on the first side, and wherein the etch stop layer is between the first insulating film and the second insulating film.

11. A semiconductor device comprising:

a substrate comprising a first side and a second side that is opposite to the first side;

an active pattern that is on the first side and extends in a first direction;

a field insulating film that is on the first side and covers at least a part of side faces of the active pattern;

an etch stop layer that is between the substrate and the field insulating film and not between the active pattern and the field insulating film;

a gate structure that extends in a second direction intersecting the first direction, on the active pattern and the field insulating film;

a through contact that extends in a third direction intersecting the first direction and the second direction, and penetrates the field insulating film and the etch stop layer;

a buried pattern connected to the through contact, inside the substrate; and a backside wiring structure that is on the second side and electrically connected to the buried pattern.

12. The semiconductor device of claim 11, further comprising:

a source/drain region connected to the active pattern on side faces of the gate structure, wherein the through contact is electrically connected to the source/drain region.

13. The semiconductor device of claim 12, further comprising:

a frontside wiring structure that is on the first side and electrically connected to the source/drain region or the gate structure.

14. The semiconductor device of claim 11, wherein a width of the through contact decreases toward the buried pattern, and wherein a width of the buried pattern decreases toward the through contact.

15. The semiconductor device of claim 11, wherein the buried pattern extends in the first direction.

16. A semiconductor device comprising:

a substrate comprising a first side and a second side that is opposite to the first side;

an active pattern that is on the first side and extends in a first direction;

an epitaxial liner film extending along the first side of the substrate and side faces of the active pattern;

an etch stop layer that extends, on the epitaxial liner film, along the first side and does not extend along the side faces of the active pattern;

a field insulating film that is on the etch stop layer and covers at least a part of the side faces of the active pattern;

a gate structure that extends on the active pattern and the field insulating film in a second direction intersecting the first direction;

a source/drain region connected to the active pattern on the side faces of the gate structure;

a frontside wiring structure that is on the first side and electrically connected to the source/drain region or the gate structure;

a through contact that is electrically connected to the source/drain region, and penetrates the field insulating film and the etch stop layer;

a buried pattern connected to the through contact, inside the substrate; and a backside wiring structure that is on the second side and electrically connected to the buried pattern.

17. The semiconductor device of claim 16, wherein the active pattern comprises a plurality of bridge patterns which are sequentially stacked on the substrate and spaced apart from each other, and wherein each of the plurality of bridge patterns extends in the first direction and penetrates the gate structure.

18. The semiconductor device of claim 16, wherein the backside wiring structure is configured to apply a power supply voltage to the source/drain region through the buried pattern and the through contact.

19. The semiconductor device of claim 16, further comprising:

a source/drain contact that is on the source/drain region and connects the source/drain region and the frontside wiring structure.

20. The semiconductor device of claim 16, wherein the through contact connects the frontside wiring structure and the buried pattern.

* * * * *